US012475853B2

(12) United States Patent
Kim et al.

(10) Patent No.: US 12,475,853 B2
(45) Date of Patent: Nov. 18, 2025

(54) PIXEL HAVING INITIALIZATION CIRCUIT AND DISPLAY APPARATUS INCLUDING THE SAME

(71) Applicant: Samsung Display Co., Ltd., Yongin-Si (KR)

(72) Inventors: Sunghwan Kim, Yongin-si (KR); Daehyun Kim, Yongin-si (KR); Kyoungjin Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/408,564

(22) Filed: Jan. 10, 2024

(65) Prior Publication Data

US 2024/0242676 A1 Jul. 18, 2024

(30) Foreign Application Priority Data

Jan. 16, 2023 (KR) ........................ 10-2023-0006304

(51) Int. Cl.

| | |
|---|---|
| ***G09G 3/3258*** | (2016.01) |
| ***G09G 3/20*** | (2006.01) |
| ***G09G 3/3233*** | (2016.01) |
| ***H10K 59/131*** | (2023.01) |

(52) U.S. Cl.

CPC ......... *G09G 3/3258* (2013.01); *G09G 3/2007* (2013.01); *G09G 3/3233* (2013.01); *H10K 59/131* (2023.02); *G09G 2300/0452* (2013.01); *G09G 2300/0819* (2013.01); *G09G 2300/0852* (2013.01); *G09G 2300/0861* (2013.01); *G09G 2320/0242* (2013.01)

(58) Field of Classification Search

CPC ... G09G 2300/0452; G09G 2300/0819; G09G 2300/0842; G09G 2300/0852; G09G 2300/0861; G09G 2310/0251; G09G 2310/0262; G09G 2320/0242; G09G 3/2007; G09G 3/3233; G09G 3/3258; H10K 59/131

See application file for complete search history.

(56) References Cited

U.S. PATENT DOCUMENTS

| | | | |
|---|---|---|---|
| 9,768,242 | B2 | 9/2017 | Im |
| 10,529,282 | B2 | 1/2020 | Kim |
| 10,769,999 | B2 | 9/2020 | Park et al. |
| 10,957,255 | B2 | 3/2021 | Ka et al. |

(Continued)

FOREIGN PATENT DOCUMENTS

| | | | |
|---|---|---|---|
| CN | 112037715 | A | 12/2020 |
| KR | 10-2013-0083664 | A | 7/2013 |

(Continued)

*Primary Examiner* — Chun-Nan Lin

(74) *Attorney, Agent, or Firm* — Innovation Counsel LLP

(57) ABSTRACT

Provided are a pixel and a display apparatus including the same. The pixel includes a driving circuit connected to a gate line and a data line and including a driving transistor, a light-emitting diode connected to the driving circuit, and an initialization circuit connected between an initialization voltage line and a node to which the driving circuit and the light-emitting diode are connected. The initialization circuit is configured to transmit a second initialization voltage, obtained by subtracting a certain voltage from a first initialization voltage supplied through the initialization voltage line, to the node.

2 Claims, 29 Drawing Sheets

(56) References Cited

U.S. PATENT DOCUMENTS

| | | | |
|---|---|---|---|
| 11,580,906 | B2 | 2/2023 | Wang et al. |
| 2006/0238135 | A1 | 10/2006 | Kimura |
| 2006/0262130 | A1* | 11/2006 | Kim ..................... G09G 3/3233 345/589 |
| 2013/0181967 | A1 | 7/2013 | Lee et al. |
| 2021/0343234 | A1* | 11/2021 | Yoon .................. H10K 59/1213 |
| 2022/0367597 | A1* | 11/2022 | Nishiyama ........... G09G 3/3233 |
| 2023/0225160 | A1 | 7/2023 | Cho et al. |

FOREIGN PATENT DOCUMENTS

| | | | |
|---|---|---|---|
| KR | 10-2017-0060214 | A | 6/2017 |
| KR | 10-2021-0111945 | A | 9/2021 |
| KR | 10-2409500 | B1 | 6/2022 |
| KR | 10-2023-0109211 | A | 7/2023 |

* cited by examiner

PIXEL HAVING INITIALIZATION CIRCUIT AND DISPLAY APPARATUS INCLUDING THE SAME

CROSS-REFERENCE TO RELATED APPLICATION

This application is based on and claims priority under 35 U.S.C. § 119 to Korean Patent Application No. 10-2023-0006304, filed on Jan. 16, 2023, in the Korean Intellectual Property Office, the disclosure of which is incorporated by reference herein in its entirety.

BACKGROUND

1. Field

One or more embodiments relate to a pixel and a display apparatus including the same, and more particularly, to a display apparatus including pixels that emit light of different colors.

2. Description of the Related Art

In general, an organic light-emitting display apparatus includes a plurality of pixels each including an organic light-emitting diode and a thin-film transistor. Color pixels that emit light of different colors may have different electrical characteristics according to emission layers constituting organic light-emitting diodes.

SUMMARY

One or more embodiments include a pixel for compensating for electrical characteristics of an organic light-emitting diode for each of pixels that emit light of different colors, and a display apparatus with improved image quality including the pixel. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a pixel includes a driving circuit connected to a gate line and a data line and including a driving transistor, a light-emitting diode connected to the driving circuit, and an initialization circuit connected between an initialization voltage line and a node to which the driving circuit and the light-emitting diode are connected. The initialization circuit is configured to transmit a second initialization voltage, obtained by subtracting a certain voltage from a first initialization voltage supplied through the initialization voltage line, to the node.

The initialization circuit may include an initialization transistor including a gate connected to an initialization control line, a first terminal connected to the node, and a second terminal, and a diode-connected transistor including a first terminal connected to the second terminal of the initialization transistor, and a gate and a second terminal connected to the initialization voltage line.

The initialization circuit may include an initialization transistor including a gate connected to an initialization control line, a first terminal connected to the node, and a second terminal, and a plurality of diode-connected transistors connected in series between the initialization transistor and the initialization voltage line. The plurality of diode-connected transistors may include a first diode-connected transistor including a first terminal connected to a second terminal of a diode-connected transistor adjacent to the first diode-connected transistor, and a gate and a second terminal connected to the initialization voltage line, and a second diode-connected transistor including a first terminal connected to the second terminal of the initialization transistor, and a gate and a second terminal connected to a first terminal of a diode-connected transistor adjacent to the second diode-connected transistor.

The initialization circuit may include an initialization transistor including a gate connected to an initialization control line, a first terminal, and a second terminal connected to the initialization voltage line, and a diode-connected transistor including a first terminal connected to the node, and a gate and a second terminal connected to the first terminal of the initialization transistor.

The initialization circuit may include an initialization transistor including a gate connected to an initialization control line, a first terminal, and a second terminal connected to the initialization voltage line, and a plurality of diode-connected transistors connected in series between the node and the initialization transistor. The plurality of diode-connected transistors may include a first diode-connected transistor including a first terminal connected to a second terminal of a diode-connected transistor adjacent to the first diode-connected transistor, and a gate and a second terminal connected to the first terminal of the initialization transistor, and a second diode-connected transistor including a first terminal connected to the node, and a gate and a second terminal connected to a first terminal of a diode-connected transistor adjacent to the second diode-connected transistor.

According to one or more embodiments, a display apparatus includes a first pixel including a first pixel circuit, and a first light-emitting diode connected to the first pixel circuit and emitting light of a first color, and a second pixel including a second pixel circuit, and a second light-emitting diode connected to the second pixel circuit and emitting light of a second color. The first pixel circuit includes a driving circuit connected to a gate line and a data line and including a driving transistor, and an initialization circuit connected between an initialization voltage line and a first node to which the driving circuit and the first light-emitting diode are connected. The initialization circuit of the first pixel circuit may be configured to transmit a first initialization voltage supplied through the initialization voltage line to the first node. The second pixel circuit includes a driving circuit connected to a gate line and a data line and comprising a driving transistor, and an initialization circuit connected between the initialization voltage line and a first node to which the driving circuit of the second pixel circuit and the second light-emitting diode are connected. The initialization circuit of the second pixel circuit may be configured to transmit a second initialization voltage, obtained by subtracting a certain voltage from the first initialization voltage, to the first node of the second pixel circuit.

The initialization circuit of the first pixel circuit may include a first initialization transistor including a gate connected to an initialization control line, a first terminal connected to the first node of the first pixel circuit, and a second terminal connected to the initialization voltage line.

The initialization circuit of the second pixel circuit may include a second initialization transistor including a gate connected to an initialization control line, a first terminal connected to the first node of the second pixel circuit, and a second terminal connected to a second node of the second pixel circuit, and a diode-connected transistor including a first terminal connected to the second node of the second pixel circuit, and a gate and a second terminal connected to the initialization voltage line.

The display apparatus may further include a plurality of second pixels comprising the second pixel, the plurality of second pixels comprising second nodes, a node connection line configured to connect the second nodes of the plurality of second pixels.

The initialization circuit of the second pixel circuit may include a second initialization transistor including a gate connected to an initialization control line, a first terminal connected to the first node of the second pixel circuit, and a second terminal connected to a second node of the second pixel circuit, and a plurality of diode-connected transistors connected in series between the second node of the second pixel circuit and the initialization voltage line. The plurality of diode-connected transistors may include a first diode-connected transistor including a first terminal connected to a second terminal of a diode-connected transistor adjacent to the first diode-connected transistor, and a gate and a second terminal connected to the initialization voltage line, and a second diode-connected transistor including a first terminal connected to the second node of the second pixel circuit, and a gate and a second terminal connected to a first terminal of a diode-connected transistor adjacent to the second diode-connected transistor.

The display apparatus may further include a plurality of second pixels comprising the second pixel, the plurality of second pixels comprising second nodes, and a node connection line configured to connect the second nodes of the plurality of second pixels.

The initialization circuit of the second pixel circuit may include an initialization transistor including a gate connected to an initialization control line, a first terminal, and a second terminal connected to the initialization voltage line, and a diode-connected transistor including a first terminal connected to the first node of the second pixel circuit, and a gate and a second terminal connected to the first terminal of the initialization transistor.

The initialization circuit of the second pixel circuit may include an initialization transistor including a gate connected to an initialization control line, a first terminal, and a second terminal connected to the initialization voltage line, and a plurality of diode-connected transistors connected in series between the first node of the second pixel circuit and the initialization transistor. The plurality of diode-connected transistors may include a first diode-connected transistor including a first terminal connected to a second terminal of a diode-connected transistor adjacent to the first diode-connected transistor, and a gate and a second terminal connected to the first terminal of the initialization transistor, and a second diode-connected transistor including a first terminal connected to the first node of the second pixel circuit, and a gate and a second terminal connected to a first terminal of a diode-connected transistor adjacent to the second diode-connected transistor.

The display apparatus may further include a substrate in which a display area where the first pixel and the second pixel are located and a peripheral area surrounding the display area are defined, and an initialization voltage supply line located in the peripheral area of the substrate and configured to supply the first initialization voltage to the initialization voltage line.

The display apparatus may further include a third pixel including a third pixel circuit, and a third light-emitting diode connected to the third pixel circuit and emitting light of a third color, wherein an initialization circuit of the third pixel circuit is the same as the initialization circuit of the first pixel circuit.

The display apparatus may further include a third pixel including a third pixel circuit, and a third light-emitting diode connected to the third pixel circuit and emitting light of a third color, wherein an initialization circuit of the third pixel circuit is the same as the initialization circuit of the second pixel circuit.

According to one or more embodiments, a display apparatus includes a substrate in which a display area and a peripheral area surrounding the display area are defined, a first pixel and a second pixel located in the display area, a first initialization voltage line located in the display area and connected to the first pixel, a second initialization voltage line located in the display area and connected to the second pixel, an initialization voltage supply line located in the peripheral area and connected to the first initialization voltage line, and a diode-connected transistor located in the peripheral area and connected between the initialization voltage supply line and the second initialization voltage line. The first pixel may include a driving circuit connected to a gate line and a data line, and including a driving transistor, a light-emitting diode connected to the driving circuit, and a first initialization circuit connected between the first initialization voltage line and a node to which the driving circuit and the light-emitting diode of the first pixel are connected. The second pixel includes a driving circuit connected to a gate line and a data line, and comprising a driving transistor, a light-emitting diode connected to the driving circuit of the second pixel, and a second initialization circuit connected between the second initialization voltage line and a node to which the driving circuit and the light-emitting diode of the second pixel are connected.

The first initialization circuit may include a first initialization transistor including a gate connected to an initialization control line, a first terminal connected to the node to which the driving circuit and the light-emitting diode of the first pixel are connected, and a second terminal connected to the first initialization voltage line, and the second initialization circuit may include a second initialization transistor including a gate connected to the initialization control line, a first terminal connected to the node to which the driving circuit and the light-emitting diode of the second pixel are connected, and a second terminal connected to the second initialization voltage line.

A plurality of diode-connected transistors including the diode-connected transistor may be located to respectively correspond to a plurality of rows of the display area. The diode-connected transistor may be located to correspond to one of a plurality of rows of the display area.

BRIEF DESCRIPTION OF THE DRAWINGS

The above and other aspects and features of certain embodiments will be more apparent from the following description taken in conjunction with the accompanying drawings.

DETAILED DESCRIPTION

Figure 1A:
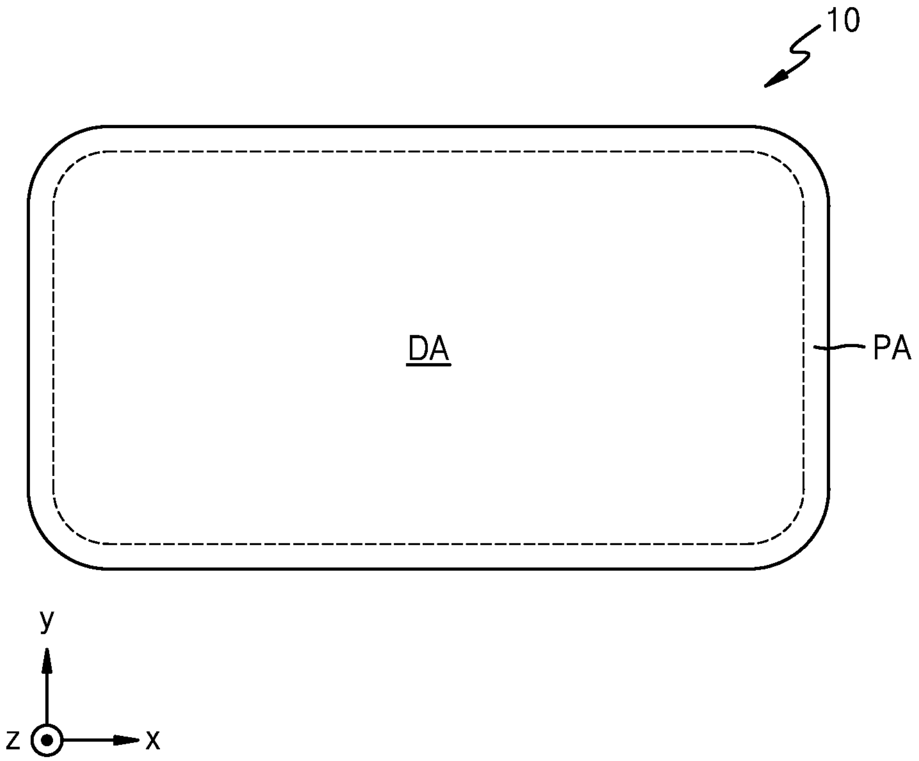
FIGS. 1A, 1B, and 2 are views schematically illustrating a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description.

Effects and features of the disclosure, and methods for achieving them will be clarified with reference to embodiments described below in detail with reference to the drawings. However, the disclosure is not limited to the following embodiments and may be embodied in various forms.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," and "having," are intended to indicate the existence of the features or elements described in the specification, and are not intended to preclude the possibility that one or more other features or elements may exist or may be added.

It will be further understood that, when a layer, region, or element is referred to as being "on" another layer, region, or element, it may be directly on the other layer, region, or element, or may be indirectly on the other layer, region, or element with intervening layers, regions, or elements therebetween.

Sizes of elements in the drawings may be exaggerated or contracted for convenience of explanation. For example, because sizes and thicknesses of elements in the drawings are arbitrarily illustrated for convenience of explanation, the disclosure is not limited thereto.

"A and/or B" is used herein to select only A, select only B, or select both A and B. Also, "at least one of A and B" is used herein to select only A, select only B, or select both A and B.

When X and Y are connected to each other in the following embodiments, it may include cases where X and Y are electrically connected to each other, X and Y are functionally connected to each other, and X and Y are directly connected to each other. X and Y may be objects, e.g., apparatuses, devices, circuits, wirings, electrodes, terminals, conductive films, and layers. Accordingly, a connection relationship is not limited to a certain connection relationship, for example, a connection relationship shown in the drawings or the detailed description, and may include anything other than the connection relationship shown in the drawings or the detailed description.

For example, when X and Y are electrically connected, one or more elements, e.g., switches, transistors, capacitors, inductors, resistors, or diodes, that enable an electrical connection between X and Y may be connected between X and Y.

In the following embodiments, "on" used in association with a device state may refer to a state in which a device is activated, and "off" may refer to a state in which a device is deactivated. "on" used in association with a signal received by a device may refer to a signal for activating a device, and "off" may refer to a signal for deactivating a device. A device may be activated by a high-level voltage or a low-level voltage. For example, a P-channel transistor (P-type transistor) is activated by a low-level voltage, and an N-channel transistor (N-type transistor) is activated by a high-level voltage. Accordingly, it should be understood that "on" voltages for the P-type transistor and the N-type transistor have opposite (low and high) voltage levels.

In the following embodiments, an x-direction, a y-direction, and a z-direction are not limited to directions corresponding to three axes of the rectangular coordinate system, and may be interpreted in a broader sense. For example, the x-direction, the y-direction, and the z-direction may be perpendicular to one another, or may represent different directions that are not perpendicular to one another.

Figure 1B:
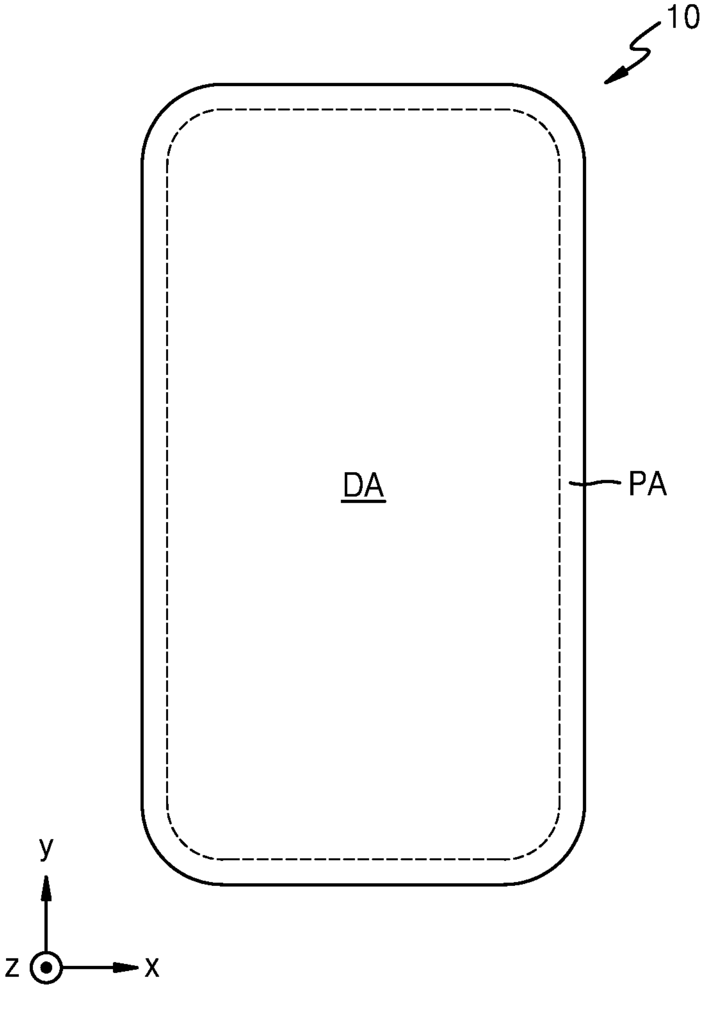
Figure 2:
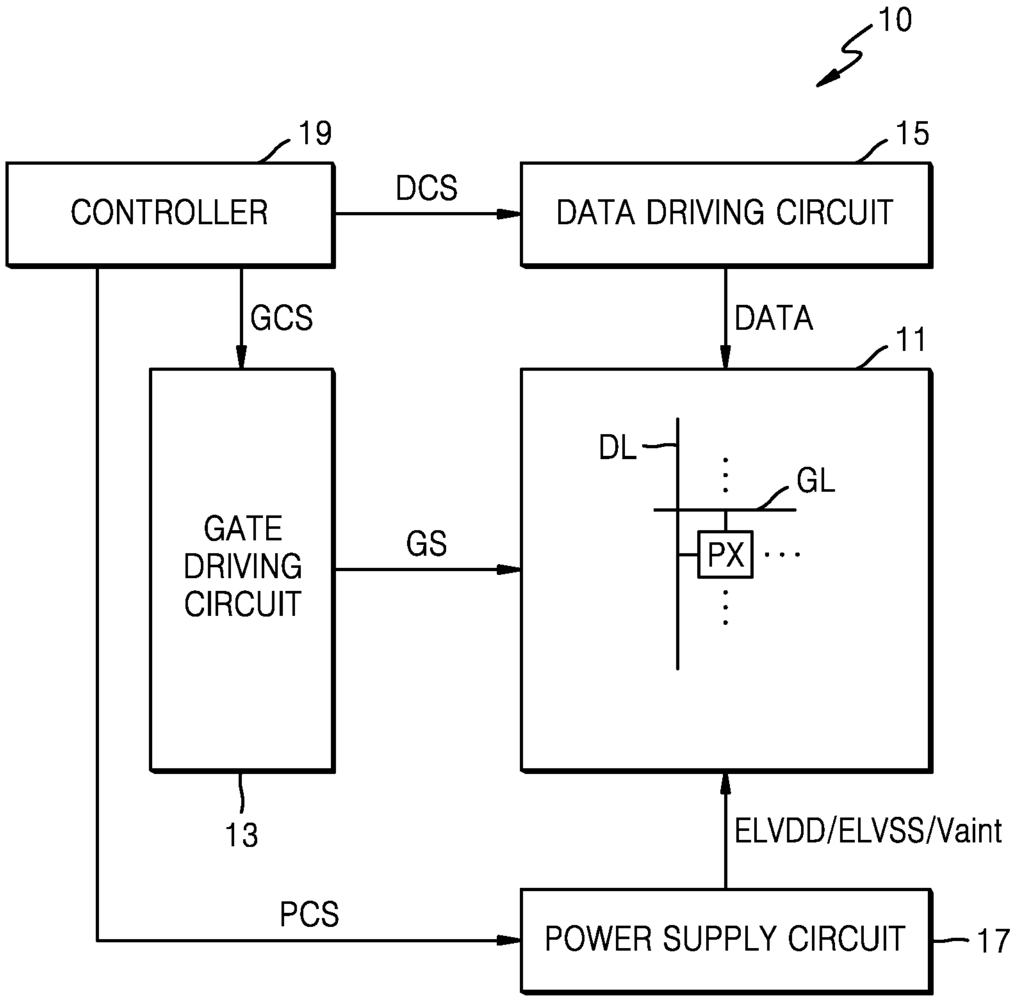

FIGS. 1A, 1B, and 2 are views schematically illustrating a display apparatus 10, according to an embodiment.

According to embodiments, the display apparatus 10 for displaying a moving image or a still image may be used as a display screen of not only a portable electronic device such as a mobile phone, a smartphone, a tablet personal (PC) computer, a mobile communication terminal, an electronic organizer, an electronic book, a portable multimedia player (PMP), a navigation device, or an ultra-mobile PC (UMPC) but also any of various products such as a television, a laptop computer, a monitor, an advertisement board, or an Internet of things (IoT) product. Also, the display apparatus 10 according to an embodiment may be used in a wearable device such as a smart watch, a watch phone, a glasses-type display, or a head-mounted display (HMD). Also, the display apparatus 10 according to an embodiment may be used as a center information display (CID) located on an instrument panel, a center fascia, or a dashboard of a vehicle, a room mirror display replacing a side-view mirror of a vehicle, or a display located on the back of a front seat for entertainment for a back seat passenger of a vehicle.

The display apparatus 10 may have an edge in an x-direction and an edge in a y-direction. The following will be described assuming that the x-direction and the y-direction are perpendicular to each other. In an embodiment, the display apparatus 10 may have a shape in which a length of the edge in the x-direction is greater than a length of the edge in the y-direction as shown in FIG. 1A. In an embodiment, the display apparatus 10 may have a shape in which a length of the edge in the y-direction is greater than a length of the edge in the x-direction as shown in FIG. 1B.

The display apparatus 10 may include a display area DA where an image is displayed and a peripheral area PA outside the display area DA. The display area DA may be entirely surrounded by the peripheral area PA.

In a plan view, the display area DA may have a rectangular shape. In an embodiment, the display area DA may have other polygonal shapes, e.g., a triangular shape, a pentagonal shape, or a hexagonal shape, a circular shape, an elliptical shape, or an irregular shape. The display area DA may have a shape with round corners. In an embodiment, the display apparatus 10 may include the display area DA having a shape in which a length in the x-direction is greater than a length in the y-direction as shown in FIG. 1A. In an embodiment, the display apparatus 10 may include the display area DA having a shape in which a length in the y-direction is greater than a length in the x-direction as shown in FIG. 1B.

Referring to FIGS. 1A and 2, the display apparatus 10 according to an embodiment may include a pixel unit 11, a gate driving circuit 13, a data driving circuit 15, a power supply circuit 17, and a controller 19.

The pixel unit 11 may be provided in the display area DA. In the peripheral area PA, various conductive lines for transmitting an electrical signal to be applied to the display area DA, outer circuits electrically connected to pixel circuits, and pads to which a printed circuit board or a driver integrated circuit (IC) chip is attached may be located. For example, in the peripheral area PA, the gate driving circuit 13, the data driving circuit 15, the power supply circuit 17, and the controller 19 may be provided.

As shown in FIG. 2, in the display area DA, a plurality of gate lines GL, a plurality of data lines DL, and a plurality of pixels PX connected to the gate lines GL and the data lines DL may be located. The plurality of pixels PX may be located in any of various arrangements such as a stripe arrangement, a PenTile® arrangement, a diamond arrangement, or a mosaic arrangement, to display an image. Each pixel PX may include an organic light-emitting diode OLED as a display element (light-emitting device), and the organic light-emitting diode OLED may be connected to a pixel circuit. Each pixel PX may emit light, for example, red light, green light, blue light, or white light, through the organic light-emitting diode OLED. Each pixel PX may be connected to at least one corresponding gate line from among the plurality of gate lines GL and a corresponding data line from among the plurality of data lines DL.

Each of the gate lines GL may extend in the x-direction (row direction) and may be connected to the pixels PX located in the same row. The gate line GL may transmit a gate signal to the pixels PX in the same row. Each of the data lines DL may extend in the y-direction (column direction) and may be connected to the pixels PX located in the same column. The data line DL may transmit a data signal to each of the pixels PX in the same column in synchronization with the gate signal.

In an embodiment, the peripheral area PA may be a non-display area where pixels PX are not located. In an embodiment, a part of the peripheral area PA may be implemented as the display area DA. For example, a plurality of pixels PX may overlap the gate driving circuit 13 in at least one corner of the peripheral area PA. Accordingly, a dead area may be reduced and the display area DA may be expanded.

The gate driving circuit 13 may be connected to the plurality of gate lines GL, may generate a gate signal in response to a driving control signal GCS from the controller 19, and may sequentially supply the gate signal to the gate lines GL. The gate line GL may be connected to a gate of a transistor included in the pixel PX. A gate signal may be a gate control signal for controlling to turn on or turn off the transistor whose gate is connected to the gate line GL. The gate signal may be a square wave signal including an on voltage for turning on the transistor and an off voltage for turning off the transistor. In an embodiment, the on voltage may be a high-level voltage (first-level voltage) or a low-level voltage (second-level voltage).

Although the pixel PX is connected to one gate line GL in FIG. 2, this is merely an example, and the pixel PX may be connected to two or more gate lines, and the gate driving circuit 13 may supply two or more gate signals to the gate lines. Applying timings of on voltage of gate signals to the gate lines may be different each other.

The data driving circuit 15 may be connected to the plurality of data lines DL, and may supply a data signal to the data lines DL in response to a driving control signal DCS from the controller 19. The data signal supplied to the data line DL may be supplied to the pixel PX to which the gate signal is supplied. The data driving circuit 15 may convert input image data having a gray level input from the controller 19 into a data signal in the form of a voltage or current.

The power supply circuit 17 may generate voltages required to drive the pixel PX in response to a driving control signal PCS from the controller 19. The power supply circuit 17 may generate a first driving voltage ELVDD and a second driving voltage ELVSS and may supply the first driving voltage ELVDD and the second driving voltage ELVSS to the pixels PX. The first driving voltage ELVDD may be a high-level voltage provided to a first electrode (pixel electrode or anode) of a display element included in the pixel PX. The second driving voltage ELVSS may be a low-level voltage provided to a second electrode (counter electrode or cathode) of the display element included in the pixel PX. The power supply circuit 17 may generate an initialization voltage Vaint and may supply the initialization voltage Vaint to the pixels PX. A voltage level of the initialization voltage Vaint may be equal to or higher than a voltage level of the second driving voltage ELVSS.

The controller 19 may generate the driving control signals GCS, DCS, and PCS based on signals input from the outside, and may supply the driving control signals GCS, DCS, and PCS to the gate driving circuit 13, the data driving circuit 15, and the power supply circuit 17. The driving control signal GCS output to the gate driving circuit 13 may include a plurality of clock signals and a gate start signal. The driving control signal DCS output to the data driving circuit 15 may include a source start signal and clock signals.

The display apparatus 10 may include a display panel, and the display panel may include a substrate. The pixels PX may be located in the display area DA of the substrate. A part or the whole of the gate driving circuit 13 may be directly formed in the peripheral area PA of the substrate during a process of forming transistors constituting a pixel circuit in the display area DA of the substrate. The data driving circuit 15, the power supply circuit 17, and the controller 19 may each be formed as a separate integrated circuit chip or one integrated circuit chip and may be located on a flexible printed circuit board (FPCB) electrically connected to a pad located on a side of the substrate. In an embodiment, the data driving circuit 15, the power supply circuit 17, and the controller 19 may be directly located on the substrate by using a chip-on-glass (COG) or chip-on-plastic (COP) manner.

Figure 3:
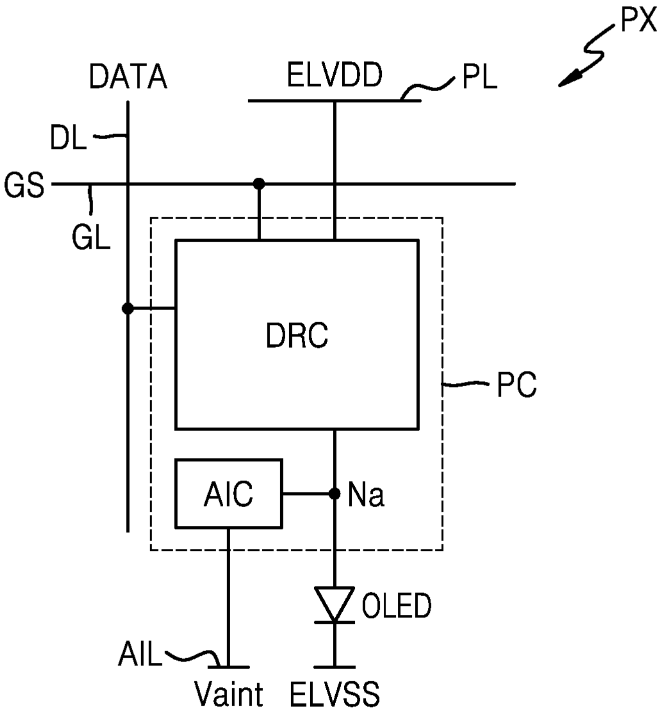
FIG. 3 is a diagram schematically illustrating a pixel, according to an embodiment.

FIG. 3 is a diagram schematically illustrating a pixel PX, according to an embodiment.

Referring to FIG. 3, the pixel PX may include a pixel circuit PC connected to the gate line GL and the data line DL, and the organic light-emitting diode OLED that is a display element connected to the pixel circuit PC.

In an embodiment, the pixel circuit PC may include a plurality of transistors and at least one capacitor. The plurality of transistors included in the pixel circuit PC may be N-type oxide thin-film transistors. In an embodiment, the plurality of transistors included in the pixel circuit PC may be P-type silicon thin-film transistors. In an embodiment, some of the plurality of transistors included in the pixel circuit may be N-type oxide thin-film transistors, and the others may be P-type silicon thin-film transistors.

The oxide thin-film transistor may be a low temperature polycrystalline oxide (LTPO) thin-film transistor in which an active pattern (semiconductor layer) includes an oxide. However, this is merely an example, and the N-type transistors are not limited thereto. For example, an active pattern (semiconductor layer) included in the N-type transistor may include an inorganic semiconductor, e.g., amorphous silicon or polysilicon, or an organic semiconductor. The silicon thin-film transistor may be a low temperature polysilicon (LTPS) thin-film transistor in which an active pattern (semiconductor layer) includes amorphous silicon or polysilicon.

The pixel circuit PC may include a driving circuit DRC and an initialization circuit AIC. The driving circuit DRC and the initialization circuit AIC may be connected to the organic light-emitting diode OLED at a node Na. The organic light-emitting diode OLED may include a pixel electrode (first electrode or anode) and a counter electrode (second electrode or cathode), and the counter electrode may receive the second driving voltage ELVSS. The organic light-emitting diode OLED may receive driving current from the driving circuit DRC to emit light and display an image.

The driving circuit DRC may be connected to a driving voltage line PL, and may be activated by a gate signal GS supplied from the gate line GL to generate and output driving current corresponding to a data signal DATA supplied from the data line DL. The organic light-emitting diode OLED may emit light with a luminance corresponding to the driving current transmitted from the driving circuit DRC. The driving circuit DRC may include a plurality of transistors and at least one capacitor. The initialization circuit AIC may be connected between the organic light-emitting diode OLED and an initialization voltage line AIL. The initialization circuit AIC may initialize the organic light-emitting diode OLED by transmitting the initialization voltage Vaint from the initialization voltage line AIL to the organic light-emitting diode OLED. A configuration and a structure of specific elements of the driving circuit DRC and the initialization circuit AIC will be described in various embodiments below.

A luminance change may occur due to a voltage remaining in the organic light-emitting diode OLED, and may be more visible in a low grade display at a high temperature. For example, the organic light-emitting diode OLED may emit light with a higher luminance than a black luminance. According to an embodiment, a luminance change of the organic light-emitting diode OLED at a low gray level may be minimized by initializing the organic light-emitting diode OLED through the initialization circuit AIC.

Figure 4:
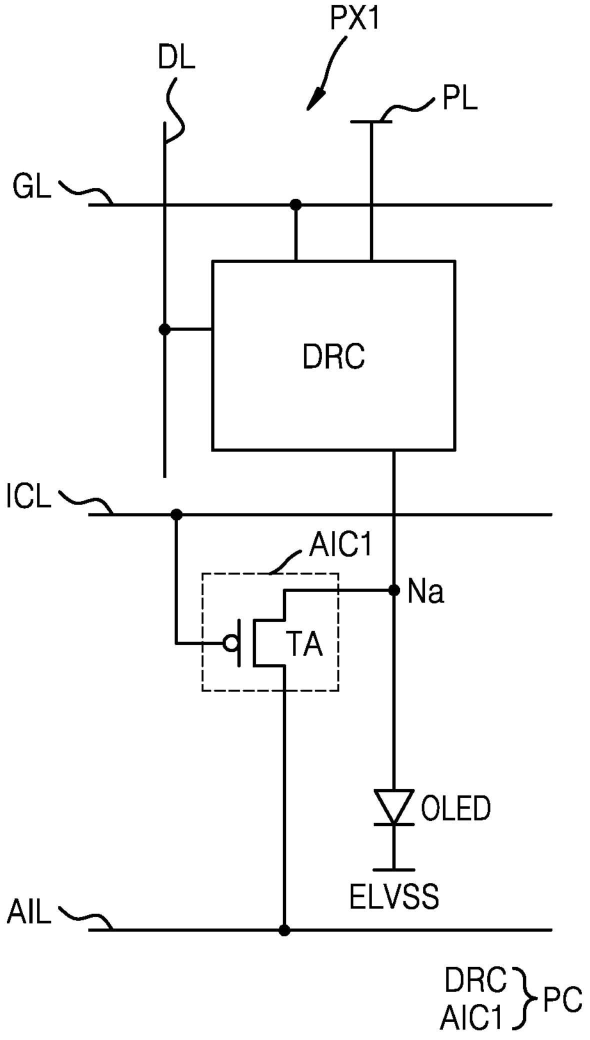
FIGS. 4 and 5 are diagrams schematically illustrating pixels, according to an embodiment.
Figure 5:
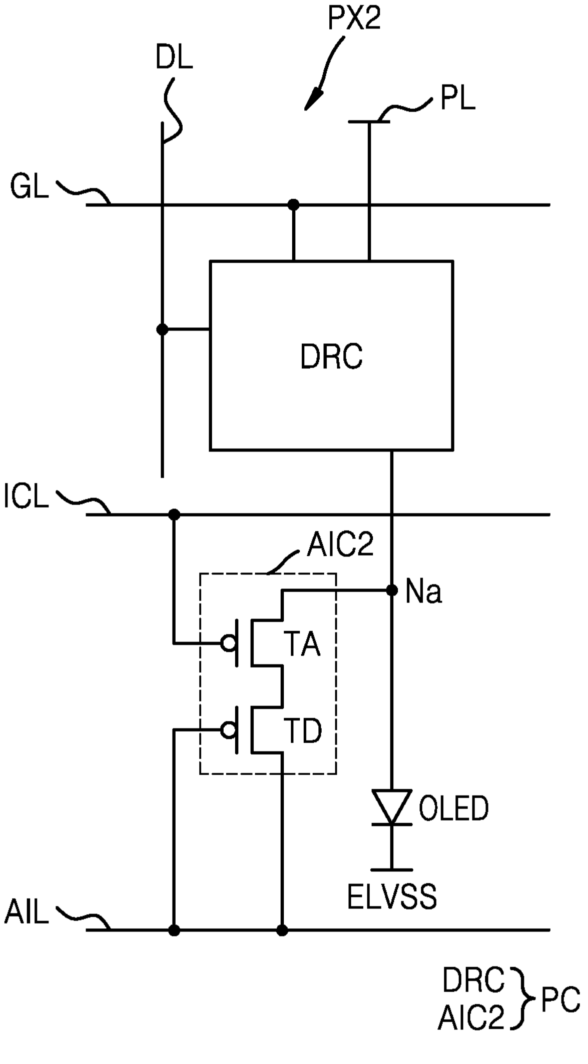

FIGS. 4 and 5 are diagrams schematically illustrating pixels PX1 and PX2, respectively, according to an embodiment.

A plurality of pixels PX may include pixels that emit light of different colors. For example, the plurality of pixels PX may include the first pixels PX1 that emit light of a first color and the second pixels PX2 that emit light of a second color. The first pixel PX1 and the second pixel PX2 may be repeatedly arranged according to a certain pattern in the x-direction and the y-direction. Each of the first pixel PX1 and the second pixel PX2 may include the pixel circuit PC and the organic light-emitting diode OLED electrically connected to the pixel circuit PC. The organic light-emitting diode OLED of each pixel may be located on the pixel circuit. The organic light-emitting diode OLED may be located directly on the pixel circuit to overlap the pixel circuit, or may be offset from the pixel circuit and may partially overlap a pixel circuit of another pixel located in an adjacent row and/or column.

FIG. 4 is a diagram schematically illustrating the first pixel PX1. FIG. 5 is a diagram schematically illustrating the second pixel PX2.

Material characteristics of the organic light-emitting diode OLED of the pixel PX may be different. Accordingly, when an initialization voltage is set according to material characteristics of a pixel that emits light of one color from among different colors, a color change may occur in pixels that emit light of different colors. In an embodiment, the display apparatus 10 may differently set an initialization voltage applied to a pixel electrode of the organic light-emitting diode OLED according to material characteristics of the organic light-emitting diode OLED. For example, by configuring an initialization circuit AIC1 of the first pixel PX1 to be different from an initialization circuit AIC2 of the second pixel PX2, an initialization voltage applied to the pixel electrode of the organic light-emitting diode OLED of the first pixel PX1 may be set to be different from an initialization voltage applied to the pixel electrode of the organic light-emitting diode OLED of the second pixel PX2.

Referring to FIG. 4, the pixel circuit PC of the first pixel PX1 may be connected to the gate line GL and the data line DL, and may include the driving circuit DRC and the initialization circuit AIC1. The driving circuit DRC may be connected between the driving voltage line PL and the organic light-emitting diode OLED. The initialization circuit AIC1 may be connected between the initialization voltage line AIL and the node Na to which the driving circuit DRC and the organic light-emitting diode OLED are connected.

The initialization circuit AIC1 of the first pixel PX1 may include an initialization transistor TA. The initialization transistor TA may be connected between the node Na and the initialization voltage line AIL. The initialization transistor TA may include a gate connected to an initialization control line ICL, a first terminal connected to the node Na, and a second terminal connected to the initialization voltage line AIL. The initialization transistor TA may be turned on by a control signal supplied from the initialization control line ICL, and may initialize the pixel electrode of the organic light-emitting diode OLED by transmitting the initialization voltage Vaint supplied through the initialization voltage line AIL to the node Na.

Referring to FIG. 5, the pixel circuit PC of the second pixel PX2 may be connected to the gate line GL and the data line DL, and may include the driving circuit DRC and the initialization circuit AIC2. The driving circuit DRC may be connected between the driving voltage line PL and the organic light-emitting diode OLED. The initialization circuit AIC2 may be connected between the initialization voltage line AIL and the node Na to which the driving circuit DRC and the organic light-emitting diode OLED are connected.

The initialization circuit AIC2 of the second pixel PX2 may include an initialization transistor TA and a diode-connected transistor TD.

The initialization transistor TA may be connected between the node Na and the initialization voltage line AIL. The initialization transistor TA may be connected between the node Na and the diode-connected transistor TD. The initialization transistor TA may include a gate connected to the initialization control line ICL, a first terminal connected to the node Na, and a second terminal connected to a first terminal of the diode-connected transistor TD.

The diode-connected transistor TD may be connected between the initialization voltage line AIL and the second terminal of the initialization transistor TA. The diode-connected transistor TD may include a gate connected to the initialization voltage line AIL, a first terminal connected to the second terminal of the initialization transistor TA, and a second terminal connected to the initialization voltage line AIL. The gate of the diode-connected transistor TD may be connected to the second terminal of the diode-connected transistor TD, and the gate and the second terminal of the diode-connected transistor TD may be connected to the initialization voltage line AIL. A voltage of the first terminal of the diode-connected transistor TD may be a value obtained by subtracting a threshold voltage Vthd of the diode-connected transistor TD from the initialization voltage Vaint.

The initialization transistor TA may be turned on by a control signal supplied from the initialization control line ICL, and may initialize the pixel electrode of the organic light-emitting diode OLED by transmitting the voltage Vaint−Vthd of the first terminal of the diode-connected transistor TD to the node Na.

According to an embodiment, because the initialization voltage Vaint (hereinafter, referred to as a 'first initialization voltage') applied to the pixel electrode of the organic light-emitting diode OLED of the first pixel PX1 and the initialization voltage (hereinafter, referred to as a 'second initialization voltage') applied to the pixel electrode of the organic light-emitting diode OLED of the second pixel PX2 may be set to be different from each other by using the diode-connected transistor TD, issues of a low gray-level luminance change and a color change due to the influence of a material of the organic light-emitting diode OLED may be improved.

Also, according to an embodiment, by using the diode-connected transistor TD, a voltage source and a voltage line for supplying the first initialization voltage Vaint and a voltage source and a voltage line for supplying the second initialization voltage Vaint−Vth do not need to be separately provided.

Figure 6:
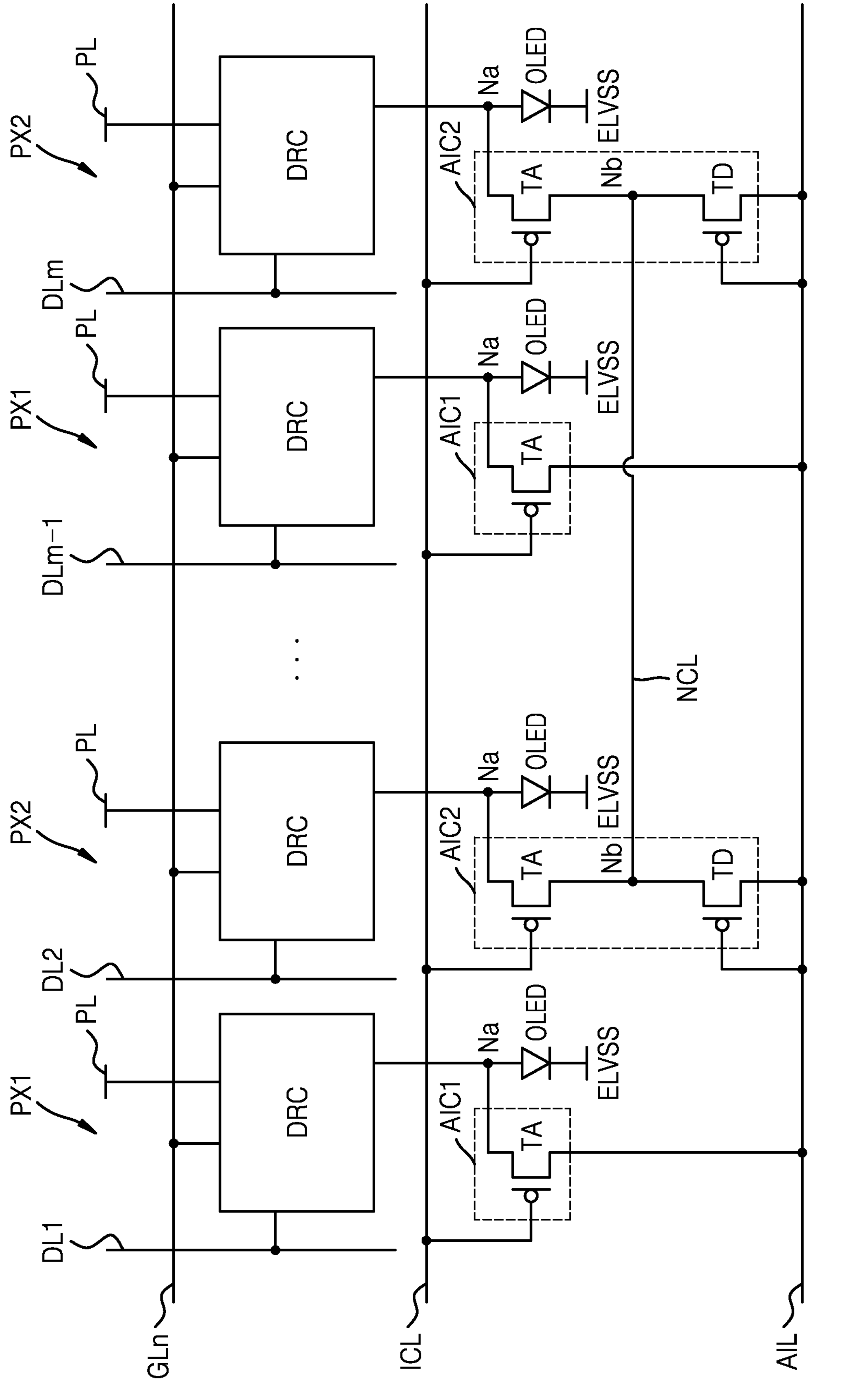
FIG. 6 is a diagram schematically illustrating a connection between pixels and an initialization voltage line, according to an embodiment.

FIG. 6 is a diagram schematically illustrating a connection between pixels and an initialization voltage line, according to an embodiment. Referring to FIG. 6, a plurality of first pixels PX1 and a plurality of second pixels PX2 may be connected to an $n^{th}$ gate line GLn of an $n^{th}$ row. In FIG. 6, the first pixel PX1 connected to a data line DL1 of a first column, the second pixel PX2 connected to a data line DL2 of a second column, the first pixel PX1 connected to a data line DLm-1 of an $m\text{-}1^{th}$ column, and the second pixel PX2 connected to a data line DLm of an $m^{th}$ column are connected to the $n^{th}$ gate line GLn. The number of first pixels PX1 and the number of second pixels PX2 located in the same row may be determined according to a pixel arrangement.

The initialization circuit AIC1 of each of the plurality of first pixels PX1 may include the initialization transistor TA as shown in FIG. 4. The initialization circuit AIC2 of each of the plurality of second pixels PX2 may include the initialization transistor TA and the diode-connected transistor TD as shown in FIG. 5.

In an embodiment, nodes Nb between the initialization transistor TA and the diode-connected transistor TD of the second pixels PX2 may be connected by a node connection line NCL. A deviation of the second initialization voltage Vaint−Vthd according to a threshold voltage deviation of the diode-connected transistor TD which may occur during a manufacturing process may be minimized by the node connection line NCL. The node connection line NCL may be provided in units of rows, or the node connection lines NCL of two or more rows may be connected to each other.

Figure 7A:
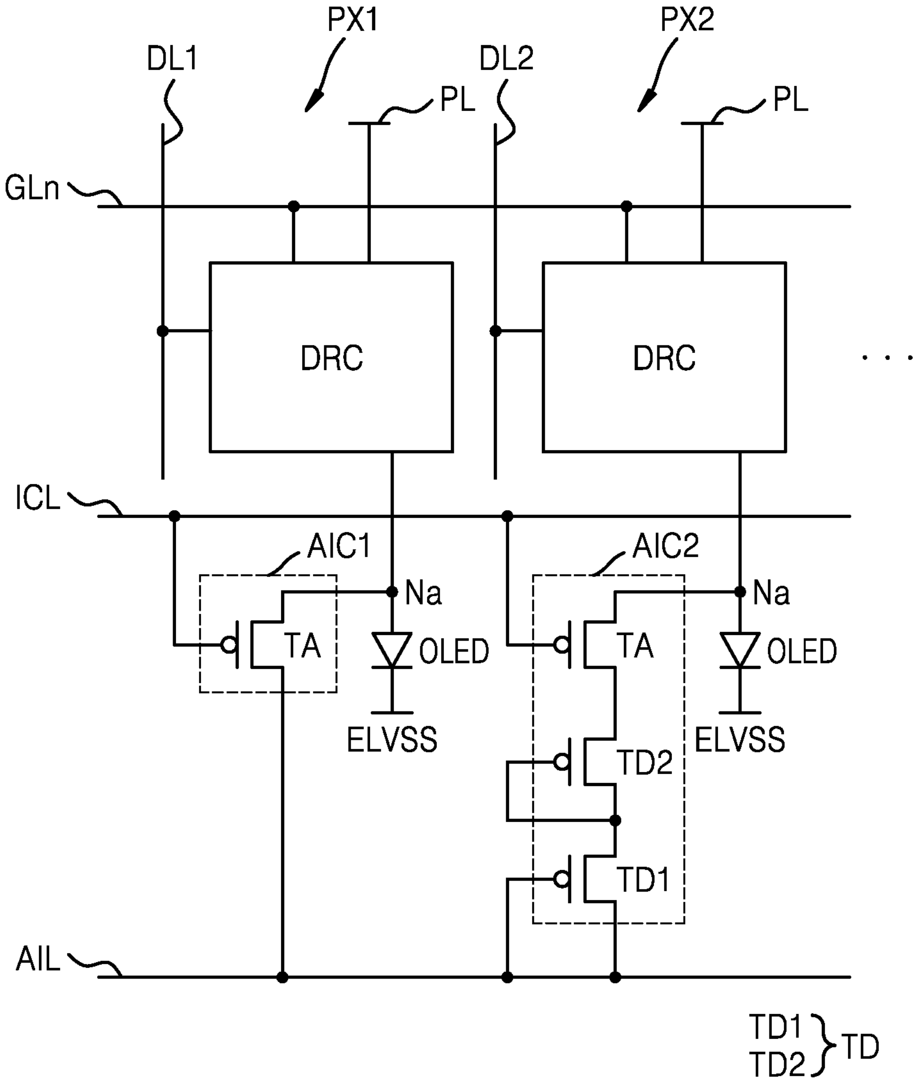
FIGS. 7A, 7B, and 8 are diagrams schematically illustrating a connection between pixels and an initialization voltage line, according to an embodiment.
Figure 7B:
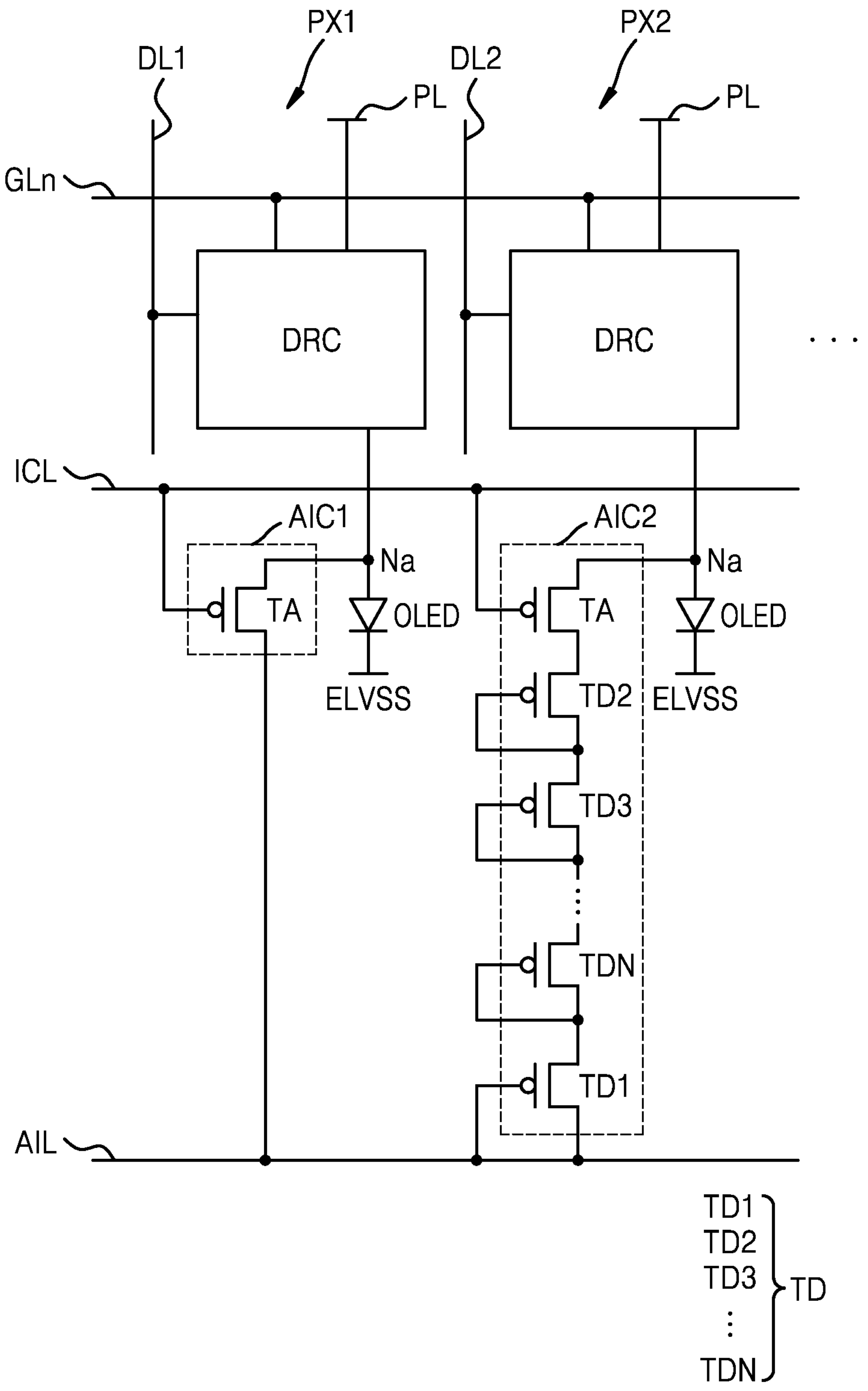
Figure 8:
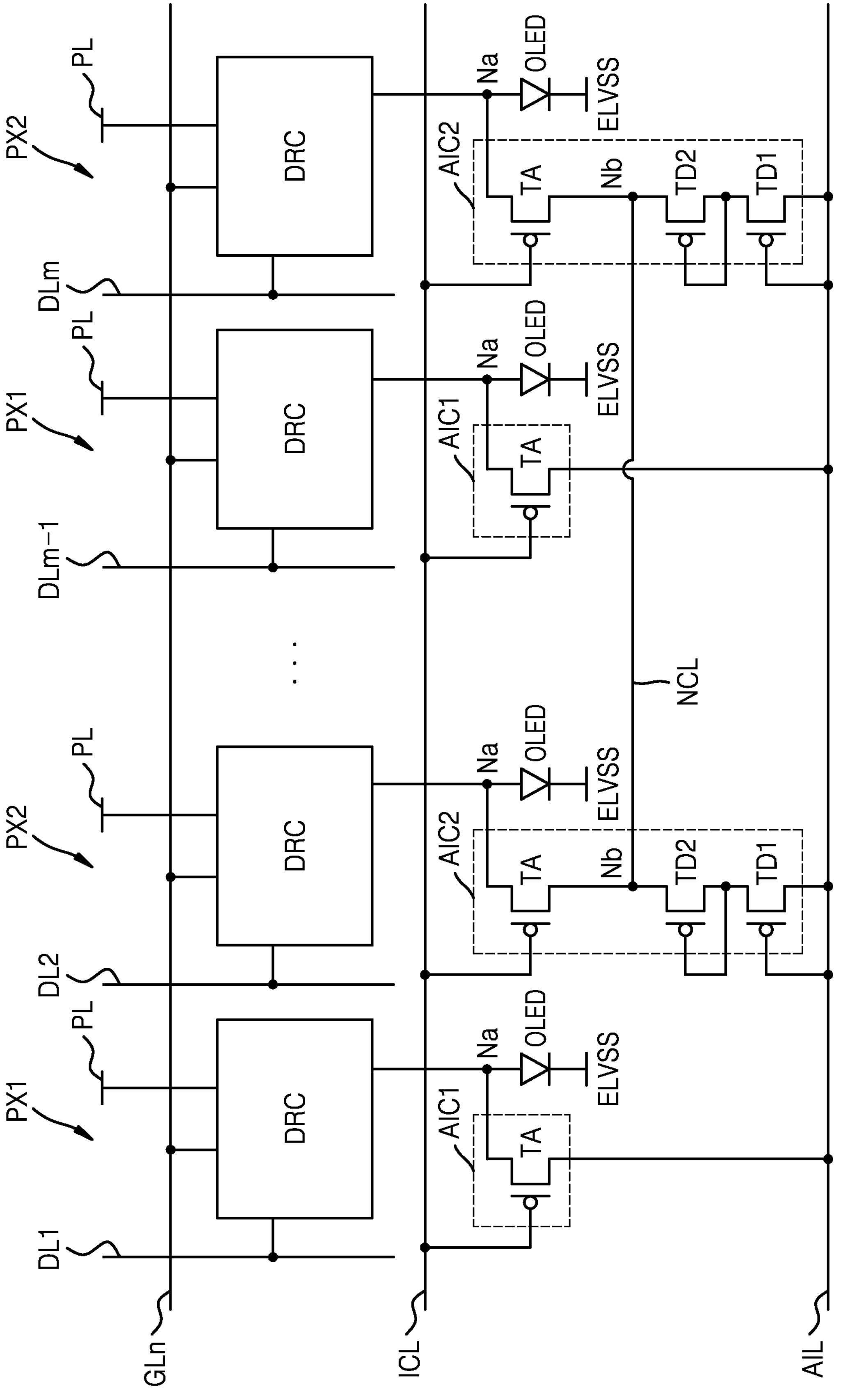

FIGS. 7A, 7B, and 8 are diagrams schematically illustrating a connection between pixels and an initialization voltage line, according to an embodiment. A difference from the above embodiments will be mainly described.

Referring to FIG. 7A, a plurality of first pixels PX1 and a plurality of second pixels PX2 may be connected to the n gate line GLn of the $n^{th}$ row. The initialization circuit AIC1 of the first pixel PX1 may include the initialization transistor TA as shown in FIG. 4.

The initialization circuit AIC2 of the second pixel PX2 may include the initialization transistor TA and a plurality of diode-connected transistors TD. The plurality of diode-connected transistors TD may include a pair of a first diode-connected transistor TD1 and a second diode-connected transistor TD2 that are connected in series. The threshold voltage Vthd of the first diode-connected transistor TD1 and the threshold voltage Vthd of the second diode-connected transistor TD2 may be the same.

The initialization transistor TA may be connected between the node Na and the plurality of diode-connected transistors TD. The initialization transistor TA may include a gate connected to the initialization control line ICL, a first terminal connected to the node Na, and a second terminal connected to a first terminal of the second diode-connected transistor TD2.

The plurality of diode-connected transistors TD may be connected between the second terminal of the initialization transistor TA and the initialization voltage line AIL. The first diode-connected transistor TD1 may include a gate connected to the initialization voltage line AIL, a first terminal connected to a second terminal of the second diode-connected transistor TD2, and a second terminal connected to the initialization voltage line AIL. The gate and the second terminal of the first diode-connected transistor TD1 may be connected to the initialization voltage line AIL. A voltage of the first terminal of the first diode-connected transistor TD1 may be a voltage Vaint−Vthd obtained by subtracting the threshold voltage Vthd of the first diode-connected transistor TD1 from the initialization voltage Vaint.

The second diode-connected transistor TD2 may include a gate connected to the first terminal of the first diode-connected transistor TD1, the first terminal connected to the second terminal of the initialization transistor TA, and the second terminal connected to the first terminal of the first diode-connected transistor TD1. The gate and the second terminal of the second diode-connected transistor TD2 may be connected to the first terminal of the first diode-connected transistor TD1. A voltage of the first terminal of the second diode-connected transistor TD2 may be a value Vaint−Vthd−Vthd=Vaint−Vthd×2 obtained by subtracting the threshold voltage Vthd of the second diode-connected transistor TD2 from the voltage Vaint−Vthd of the first terminal of the first diode-connected transistor TD1.

The initialization transistor TA of the second pixel PX2 may be turned on by a control signal supplied from the initialization control line ICL, and may initialize a pixel electrode of the organic light-emitting diode OLED by transmitting the voltage Vaint−Vthd×2 of the first terminal of the second diode-connected transistor TD2 to the node Na.

A second initialization voltage may be adjusted according to the number of diode-connected transistors TD that are connected in series. For example, as shown in FIG. 7B, first to $N^{th}$ diode-connected transistors TD1, TD2, TD3, . . . , TDN, where N is a natural number equal to or greater than 2, may be connected in series.

The first diode-connected transistor TD1 may include a first terminal connected to a second terminal of an adjacent diode-connected transistor, that is, the $N^{th}$ diode-connected transistor TDN adjacent to the first diode-connected transistor TD1, and a second terminal and a gate connected to the initialization voltage line AIL.

The second diode-connected transistor TD2 may include a first terminal connected to a second terminal of the initialization transistor TA, and a second terminal and a gate connected to a first terminal of an adjacent diode-connected transistor, that is, the third diode-connected transistor TD3 adjacent to the second diode-connected transistor TD2.

The third diode-connected transistor TD3 may include a first terminal connected to the second terminal of an adjacent diode-connected transistor, that is, the second diode-connected transistor TD2 adjacent to the third diode-connected transistor TD3, and a second terminal and a gate connected to a first terminal of an adjacent diode-connected transistor, that is, the fourth diode-connected transistor adjacent to the third diode-connected transistor TD3.

When the first to $N^{th}$ diode-connected transistors TD1, TD2, TD3, . . . , TDN that are connected in series have the same threshold voltage Vthd, a second initialization voltage may be Vaint−Vthd×N.

In an embodiment, as shown in FIG. 8, the nodes Nb of the second pixels PX2 may be connected to each other by the node connection line NCL. A deviation of the second initialization voltage Vaint−Vthd×2 according to a threshold voltage deviation of the diode-connected transistors TD which may occur during a manufacturing process may be minimized by the node connection line NCL. The node connection line NCL may be provided in units of rows, and/or the node connection lines NCL of two or more rows may be connected to each other.

Figure 9:
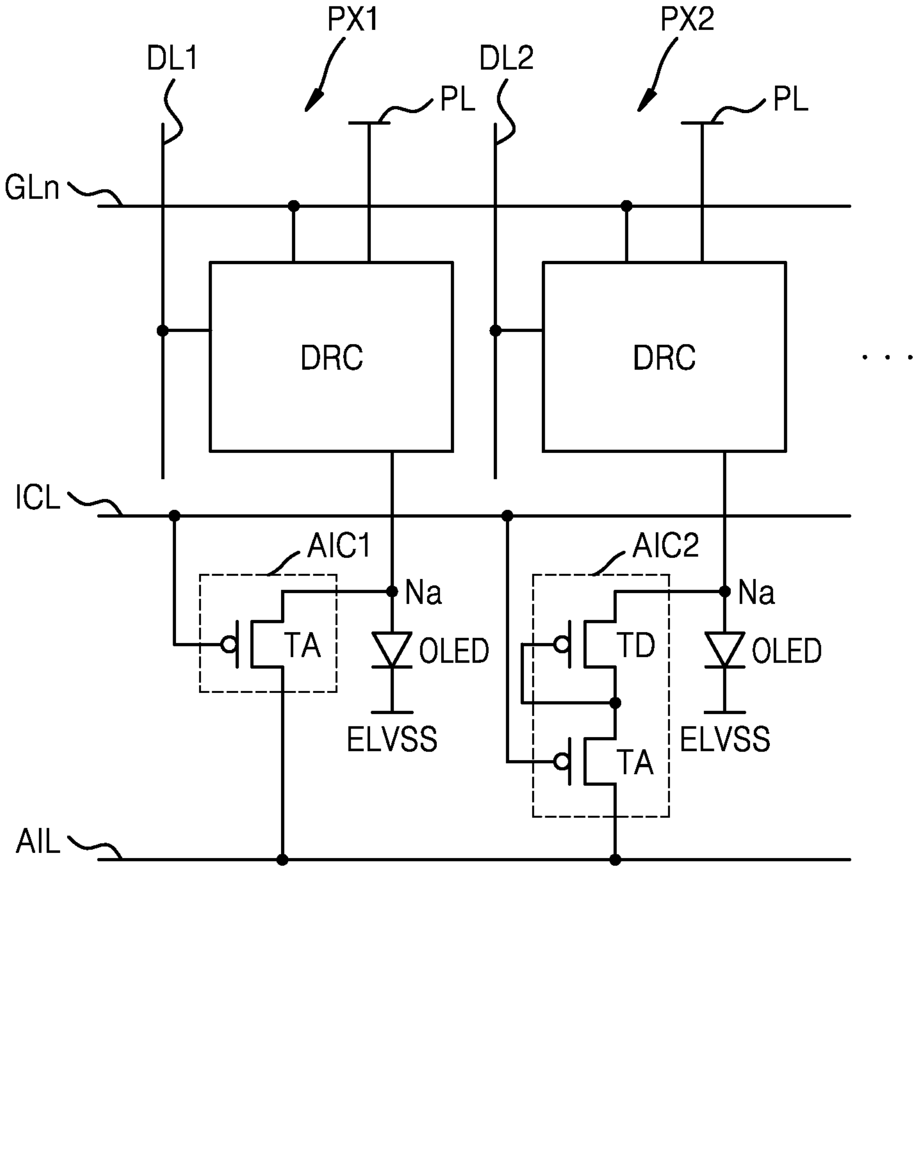
FIGS. 9 and 10 are diagrams schematically illustrating a connection between pixels and an initialization voltage line, according to an embodiment.
Figure 10:
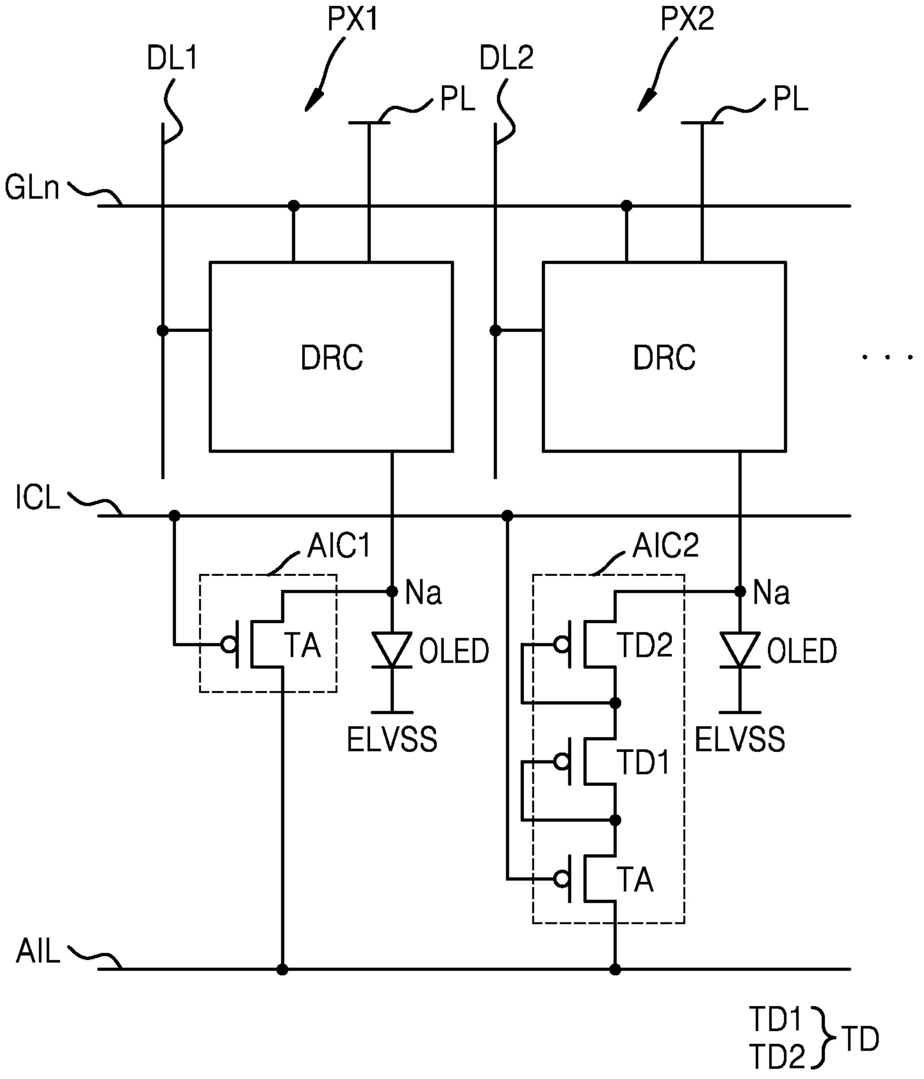

FIGS. 9 and 10 are diagrams schematically illustrating a connection between pixels PX1 and PX2 and an initialization voltage line AIL, according to an embodiment. A difference from the above embodiments will be mainly described.

Referring to FIG. 9, a plurality of first pixels PX1 and a plurality of second pixels PX2 located in different columns may be connected to the $n^{th}$ gate line GLn of the $n^{th}$ row. The initialization circuit AIC1 of the first pixel PX1 may include the initialization transistor TA as shown in FIG. 4.

The initialization circuit AIC2 of the second pixel PX2 may include the initialization transistor TA and the diode-connected transistor TD.

The initialization transistor TA may be connected between the node Na and the initialization voltage line AIL. The initialization transistor TA may be connected between the diode-connected transistor TD and the initialization voltage line AIL. The initialization transistor TA may include a gate connected to the initialization control line ICL, a first terminal connected to a second terminal of the diode-connected transistor TD, and a second terminal connected to the initialization voltage line AIL.

The diode-connected transistor TD may be connected between the node Na and the first terminal of the initialization transistor TA. The diode-connected transistor TD may include a gate connected to the first terminal of the initialization transistor TA, a first terminal connected to the node Na, and the second terminal connected to the first terminal of the initialization transistor TA. The gate and the second terminal of the diode-connected transistor TD may be connected to the first terminal of the initialization transistor TA. A voltage of the first terminal of the diode-connected transistor TD may be a value obtained by subtracting the threshold voltage Vthd of the diode-connected transistor TD from a voltage of the first terminal of the initialization transistor TA (or a voltage of the second terminal of the diode-connected transistor TD).

The initialization transistor TA of the second pixel PX2 may be turned on by a control signal supplied from the initialization control line ICL, and may transmit the initialization voltage Vaint supplied through the initialization voltage line AIL to the second terminal of the diode-connected transistor TD. A voltage of the first terminal of the diode-connected transistor TD, that is, a voltage of the node Na, may be set to be a value (second initialization voltage) obtained by subtracting the threshold voltage Vthd of the diode-connected transistor TD from the initialization voltage Vaint, and the pixel electrode of the organic light-emitting diode OLED may be initialized to the second initialization voltage Vaint−Vthd.

In an embodiment, a plurality of diode-connected transistors TD may be connected in series between the node Na and the initialization transistor TA. In FIG. 10, a pair of a first diode-connected transistor TD1 and a second diode-connected transistor TD2 are connected between the node Na and the initialization transistor TA.

The first diode-connected transistor TD1 may include a gate connected to a first terminal of the initialization transistor TA, a first terminal connected to a second terminal of the second diode-connected transistor TD2, and a second terminal connected to the first terminal of the initialization transistor TA. The gate and the second terminal of the first diode-connected transistor TD1 may be connected to the first terminal of the initialization transistor TA. A voltage of the first terminal of the first diode-connected transistor TD1 may be a value Vaint−Vthd obtained by subtracting the threshold voltage Vthd of the first diode-connected transistor TD1 from the initialization voltage Vaint.

The second diode-connected transistor TD2 may include a gate connected to the first terminal of the first diode-connected transistor TD1, a first terminal connected to the node Na, and the second terminal connected to the first terminal of the first diode-connected transistor TD1. The gate and the second terminal of the second diode-connected transistor TD2 may be connected to the first terminal of the first diode-connected transistor TD1. A voltage of the first terminal of the second diode-connected transistor TD2 may be a value Vaint−Vthd−Vthd=Vaint−Vthd×2 obtained by subtracting the threshold voltage Vthd of the second diode-connected transistor TD2 from the voltage Vaint−Vthd of the first terminal of the first diode-connected transistor TD1.

When the initialization transistor TA of the second pixel PX2 is turned on by a control signal supplied from the initialization control line ICL, due to the first diode-connected transistor TD1 and the second diode-connected transistor TD2, a voltage of the first terminal of the second diode-connected transistor TD2, that is, a voltage of the node Na, may be set to be a value (second initialization voltage) obtained by subtracting the threshold voltage Vthd of the first diode-connected transistor TD1 and the second diode-connected transistor TD2 from the initialization voltage Vaint, and a pixel electrode of the organic light-emitting diode OLED may be initialized to the second initialization voltage Vaint−Vthd×2.

FIGS. 11 to 18 are diagrams schematically illustrating a connection between pixels and an initialization voltage line, according to an embodiment. A difference from the above embodiments will be mainly described.

Figure 11:
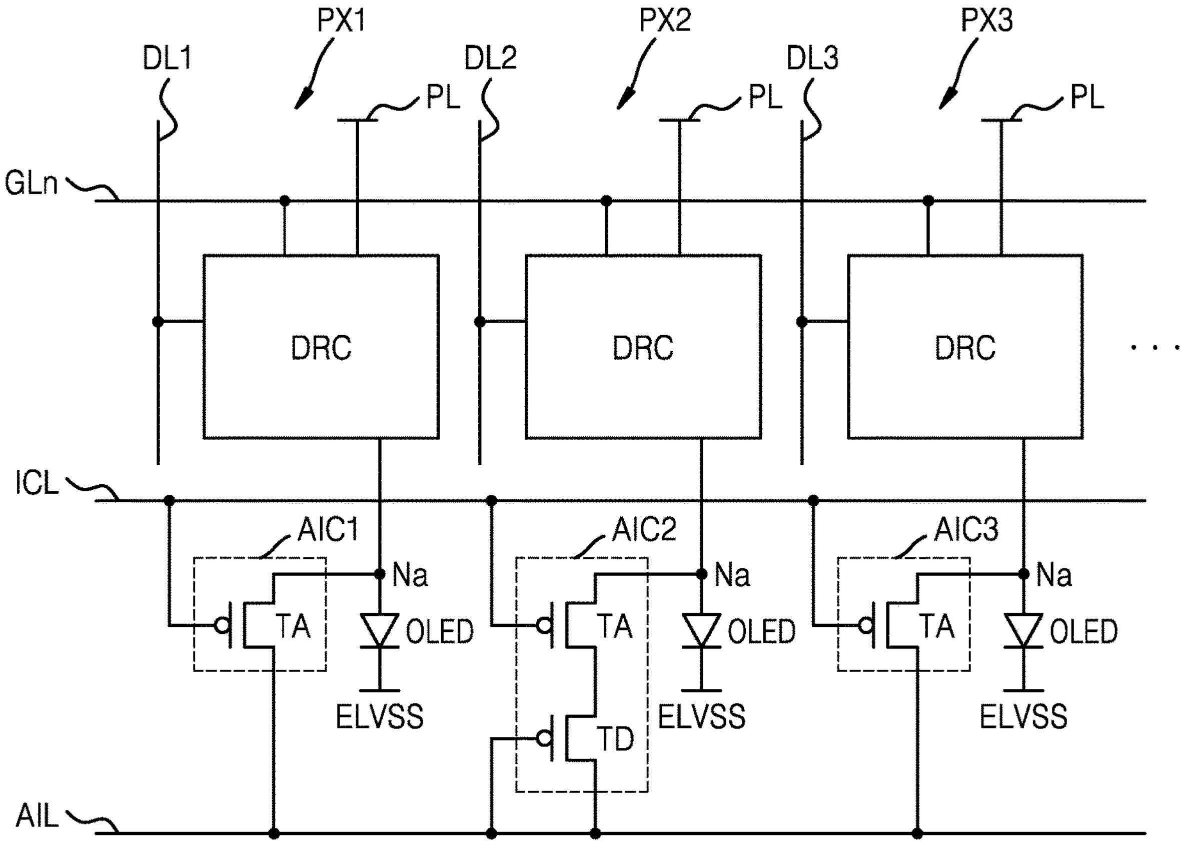
FIGS. 11, 12, 13, 14, 15, 16, 17, and 18 are diagrams schematically illustrating a connection between pixels and an initialization voltage line, according to an embodiment.

Referring to FIG. 11, a plurality of pixels PX may include pixels that emit light of different colors. For example, the plurality of pixels PX may include first pixels PX1 that emit light of a first color, second pixels PX2 that emit light of a second color, and third pixels PX3 that emit light of a third color.

The first pixel PX1, the second pixel PX2, and the third pixel PX3 may be repeatedly arranged according to a certain pattern in the x-direction and the y-direction. Each of the first pixel PX1, the second pixel PX2, and the third pixel PX3 may include the pixel circuit PC and the organic light-emitting diode OLED electrically connected to the pixel circuit PC. The organic light-emitting diode OLED of each pixel may be located on the pixel circuit PC. The organic light-emitting diode OLED may be located directly on the pixel circuit PC to overlap the pixel circuit PC, or may be offset from the pixel circuit PC and may partially overlap the pixel circuit PC of another pixel located in an adjacent row and/or column.

A plurality of first pixels PX1, a plurality of second pixels PX2, and a plurality of third pixels PX3 located in different columns may be connected to the $n^{th}$ gate line GLn of the $n^{th}$ row. The pixel circuit PC of the first pixel PX1 may be connected to the $n^{th}$ gate line GLn and a first data line DL1, and may include the driving circuit DRC and an initialization circuit AIC1. The pixel circuit PC of the second pixel PX2 may be connected to the $n^{th}$ gate line GLn and a second data line DL2, and may include the driving circuit DRC and an initialization circuit AIC2. The pixel circuit PC of the third pixel PX3 may be connected to the $n^{th}$ gate line GLn and a third data line DL3, and may include the driving circuit DRC and an initialization circuit AIC3.

By setting an initialization voltage applied to one electrode of an organic light-emitting diode of at least one color pixel from among the first pixel PX1, the second pixel PX2, and the third pixel PX3 to be different from an initialization voltage applied to one electrode of an organic light-emitting diode of the remaining color pixels, deterioration in image quality characteristics due to a difference in material characteristics of organic light-emitting diodes may be prevented.

For example, referring to FIG. 11, the initialization circuit AIC1 of the first pixel PX1 and the initialization circuit AIC3 of the third pixel PX3 may include the initialization transistor TA as shown in FIG. 4. The initialization circuit AIC2 of the second pixel PX2 may include the initialization transistor TA and the diode-connected transistor TD as shown in FIG. 5. Although not shown, the nodes Nb (see FIG. 6) between the initialization transistor TA and the diode-connected transistor TD of the second pixels PX2 may be connected by a node connection line. The node connection line may be provided in units of rows, or node connection lines of two or more rows may be connected to each other.

Figure 12:
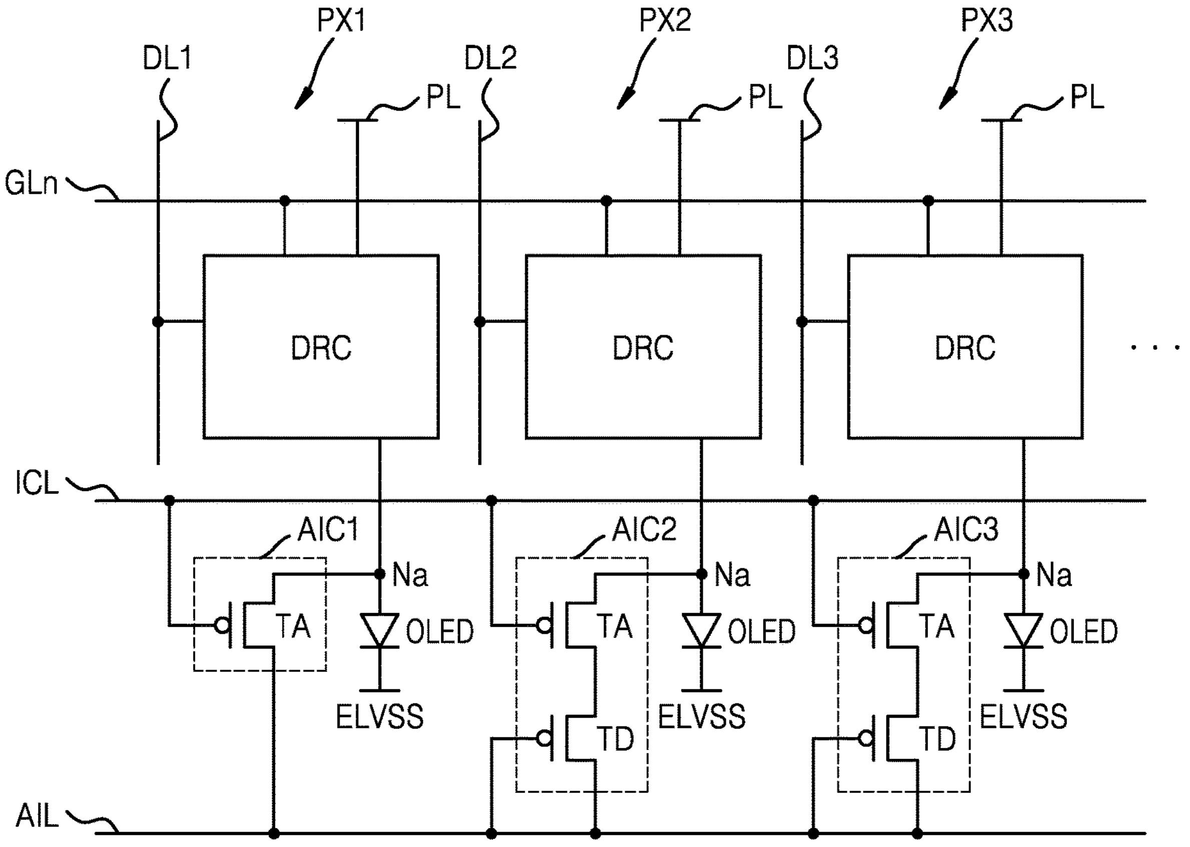

In an embodiment, referring to FIG. 12, the initialization circuit AIC1 of the first pixel PX1 may include the initialization transistor TA as shown in FIG. 4. The initialization circuit AIC2 of the second pixel PX2 and the initialization circuit AIC3 of the third pixel PX3 may include the initialization transistor TA and the diode-connected transistor TD as shown FIG. 5.

Figure 13:
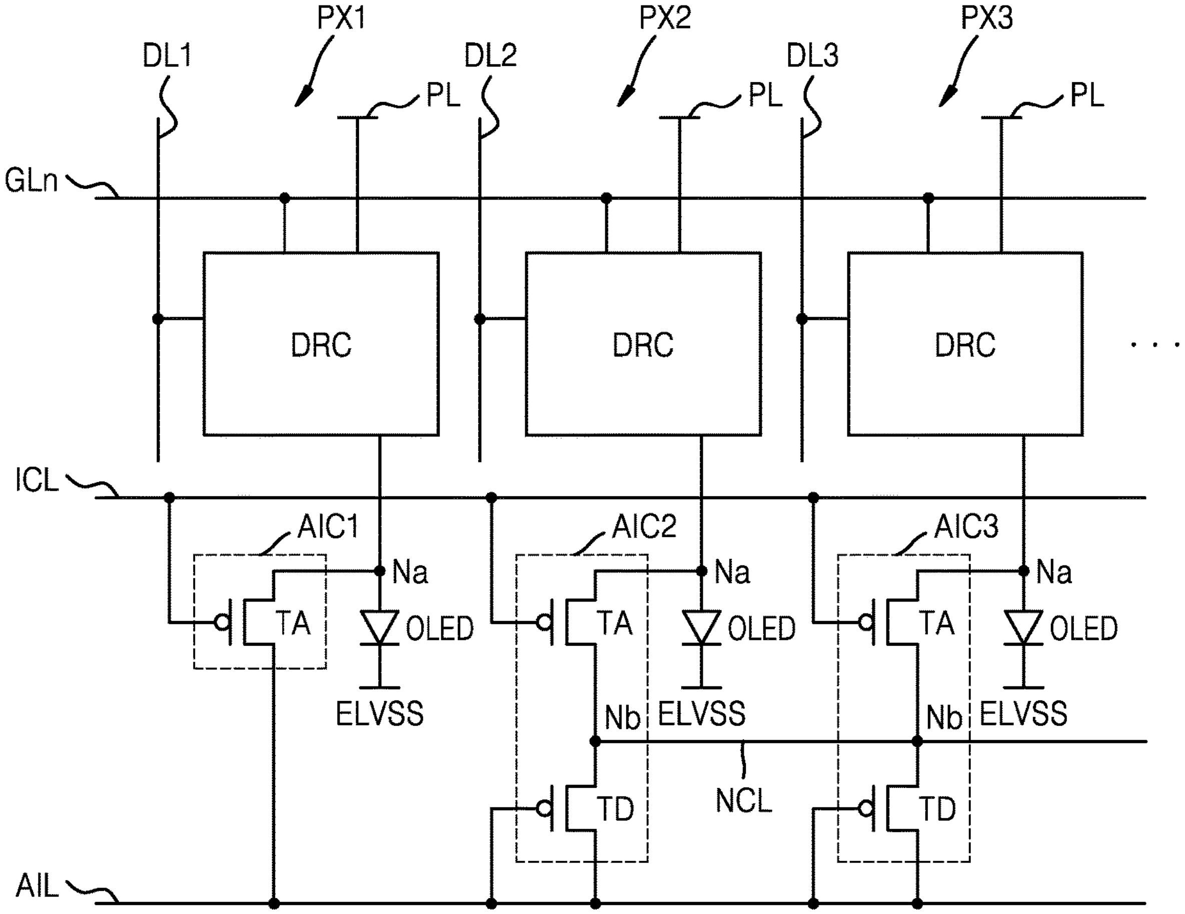

As shown in FIG. 13, the nodes Nb between the initialization transistor TA and the diode-connected transistor TD of the second pixels PX2 and the third pixels PX3 may be connected by the node connection line NCL. The node connection line NCL may be provided in units of rows, or the node connection lines NCL of two or more rows may be connected to each other.

Figure 14:
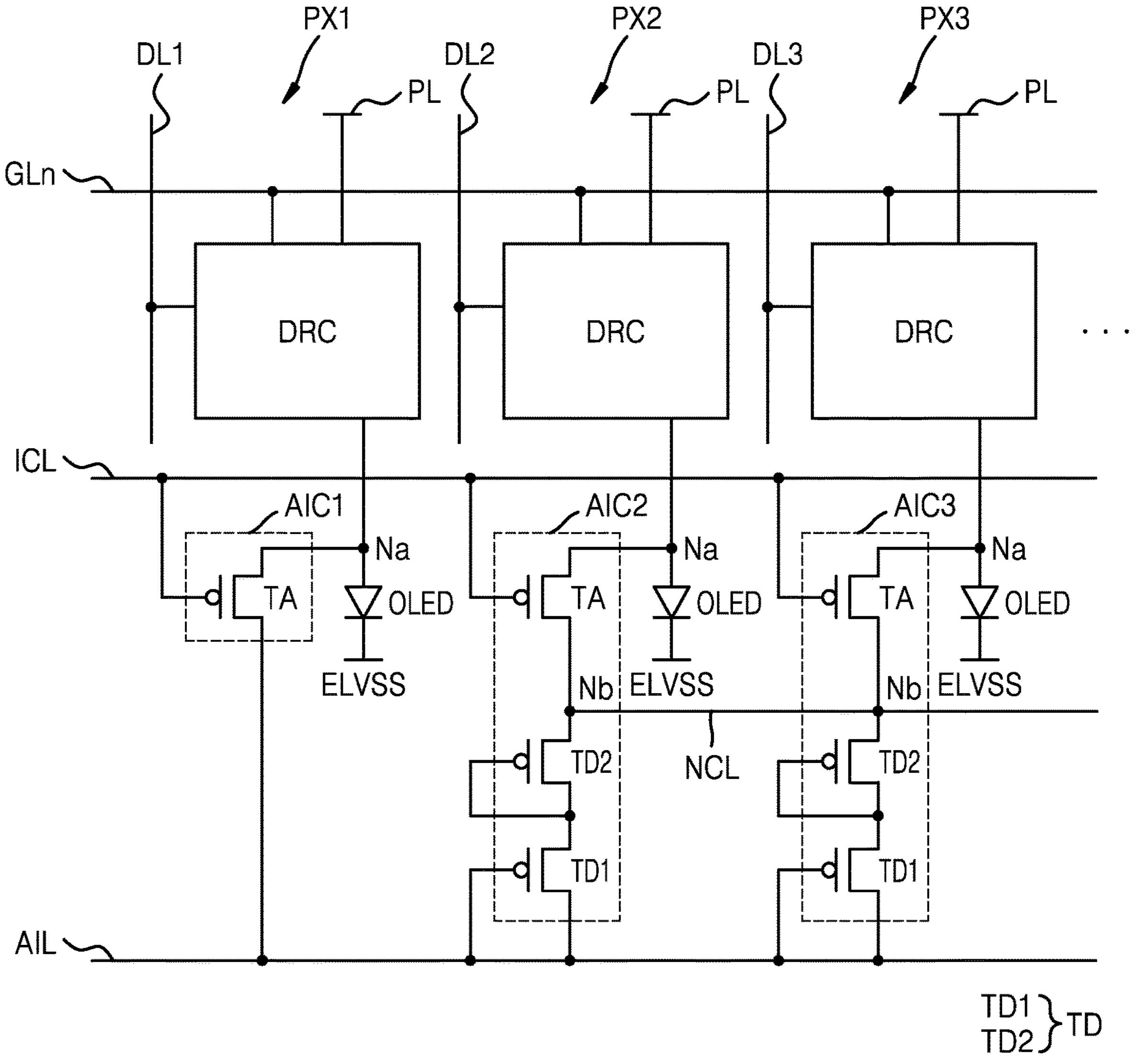

As shown in FIG. 14, the second pixels PX2 and the third pixels PX3 may include a plurality of diode-connected transistors TD that are connected in series. For example, the plurality of diode-connected transistors TD may include a pair of a first diode-connected transistor TD1 and a second diode-connected transistor TD2. The nodes Nb of the second pixels PX2 and the third pixels PX3 may be connected by the node connection line NCL. The node connection line NCL may be provided in units of rows, or the node connection lines NCL of two or more rows may be connected to each other.

Figure 15:
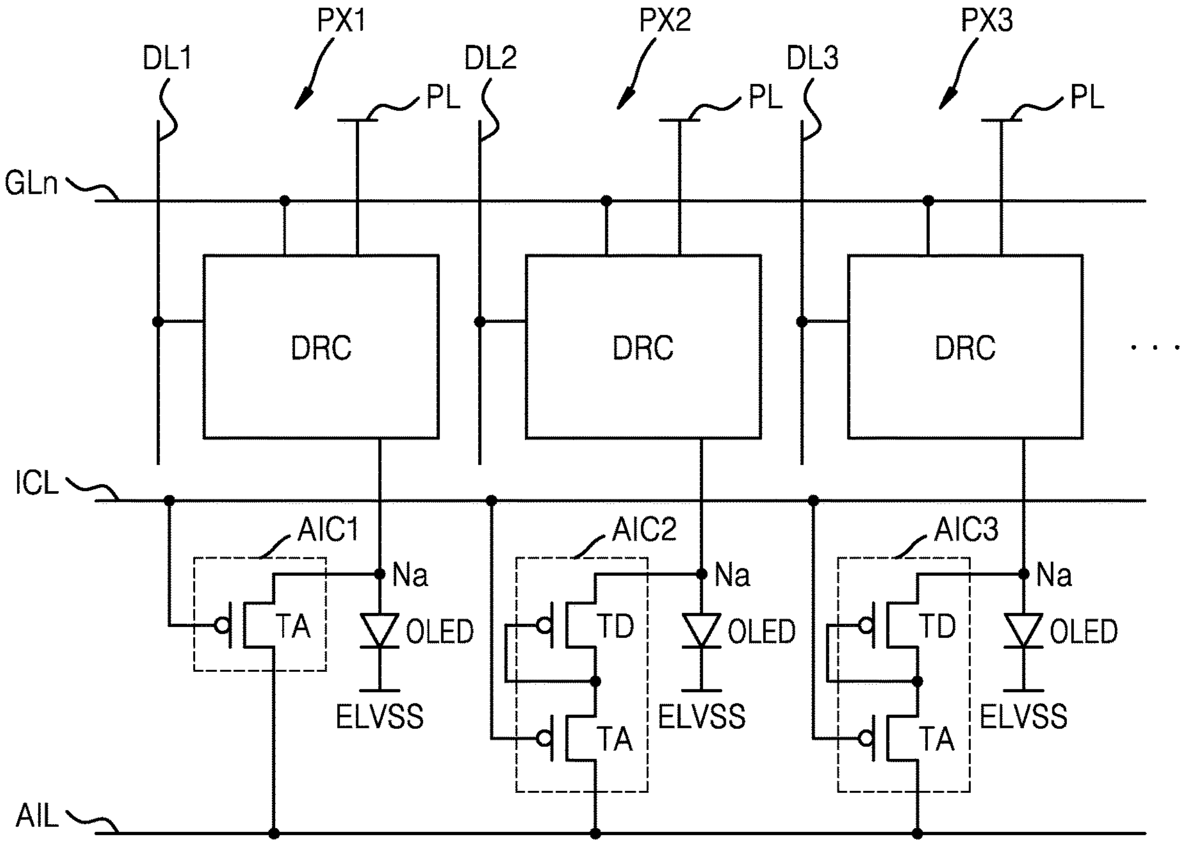
Figure 16:
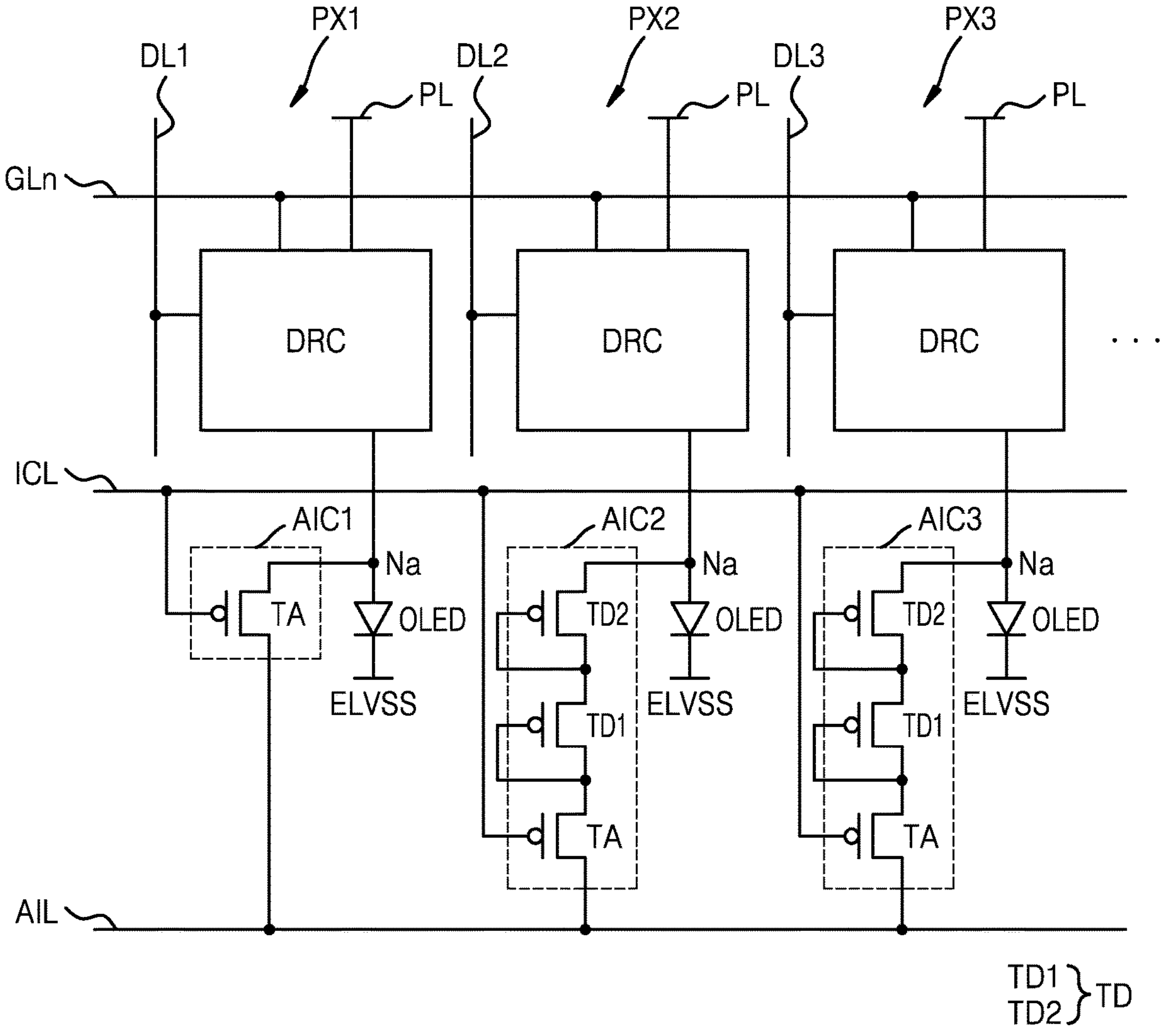

Referring to FIG. 15, the initialization transistor TA of the second pixels PX2 and the third pixels PX3 may be connected between the node Na and the initialization voltage line AIL, and the diode-connected transistor TD may be connected between the node Na and a first terminal of the initialization transistor TA. As shown in FIG. 16, the second pixels PX2 and the third pixels PX3 may include a plurality of diode-connected transistors TD that are connected in series. For example, the plurality of diode-connected transistors TD may include a pair of a first diode-connected transistor TD1 and a second diode-connected transistor TD2 that are connected in series.

In an embodiment, initialization voltages applied to electrodes of organic light-emitting diodes of the first pixel PX1, the second pixel PX2, and the third pixel PX3 may be set to be different from each other.

Figure 17:
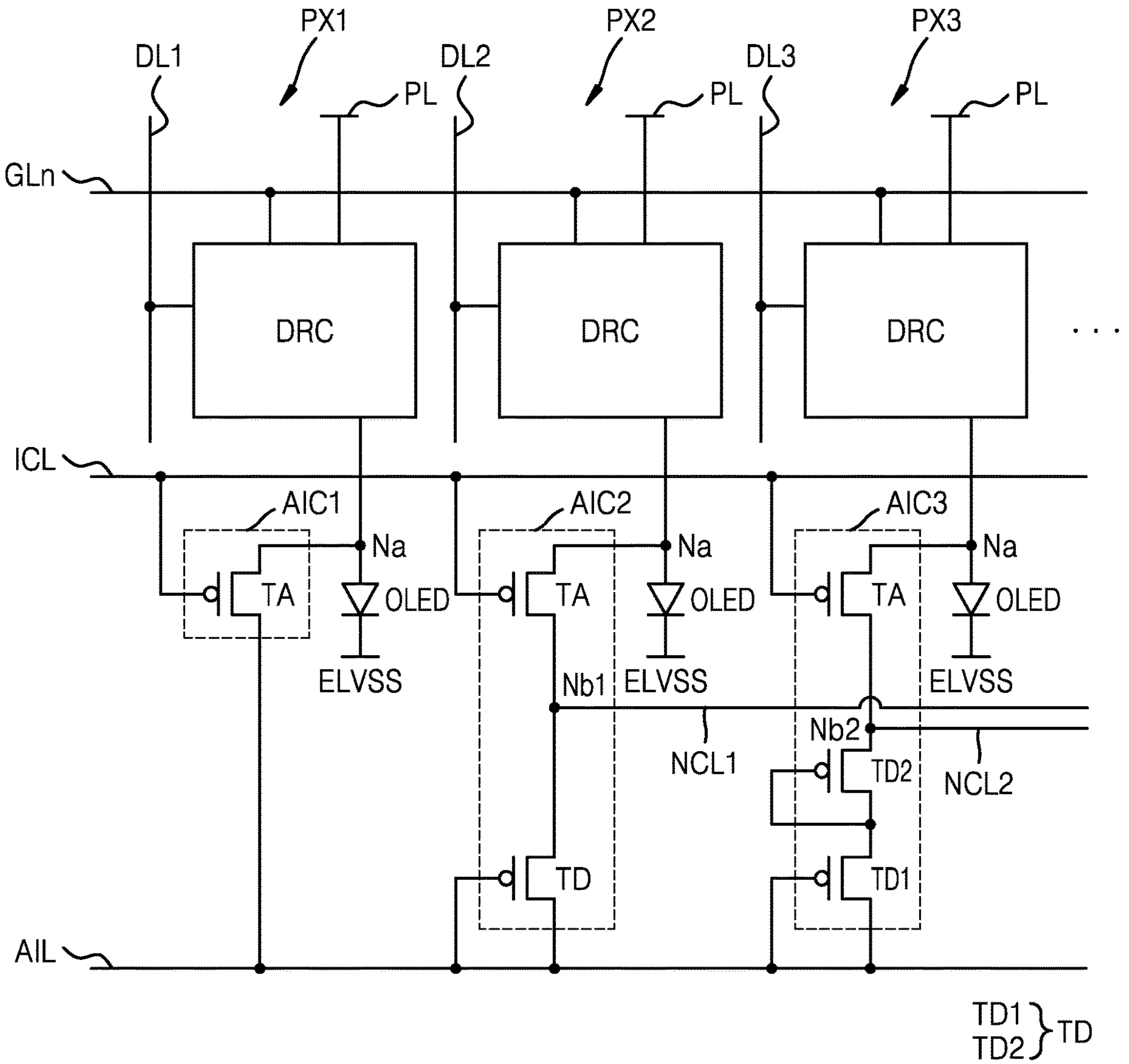
Figure 18:
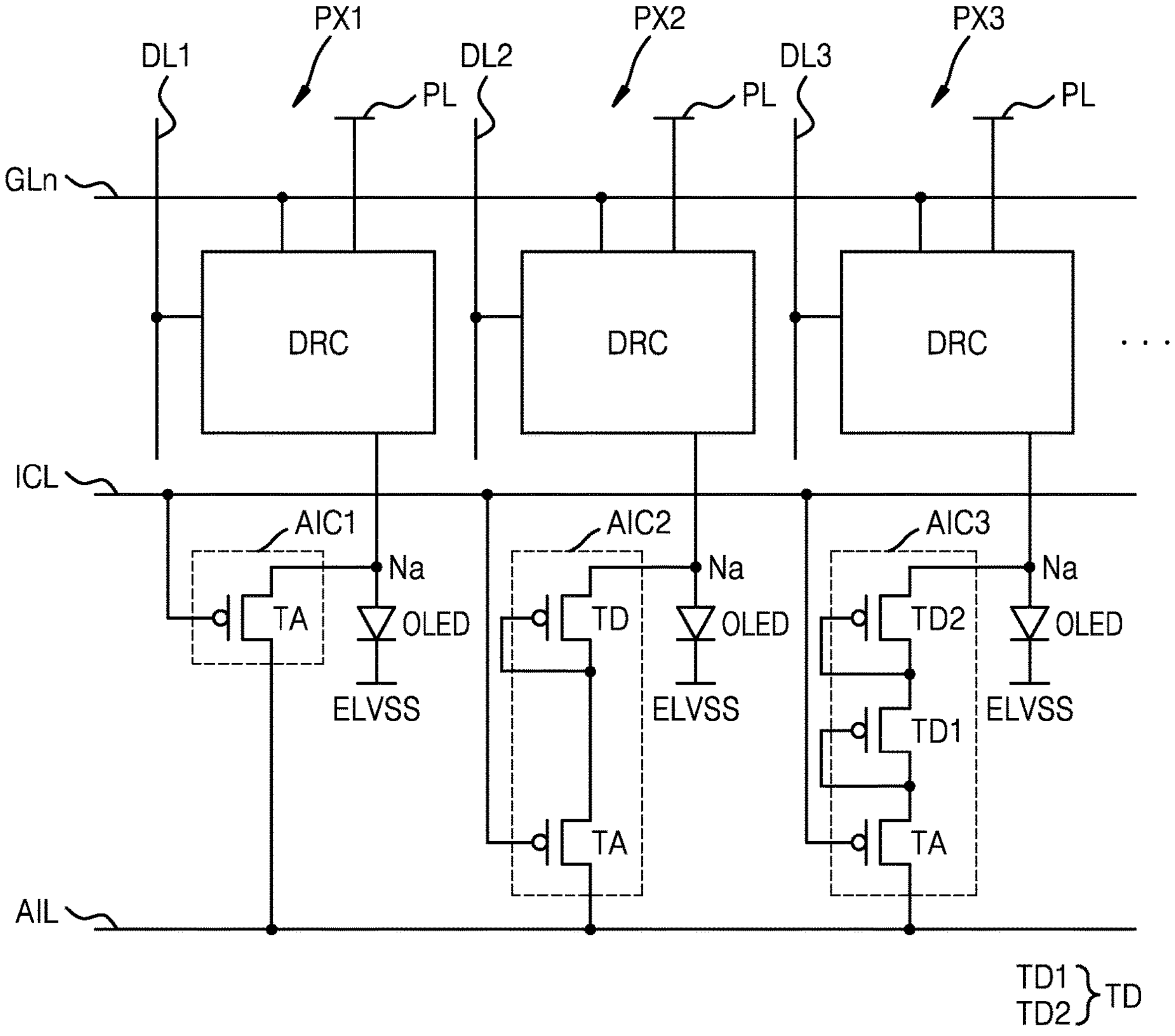

As shown in FIGS. 17 and 18, the initialization circuit AIC1 of the first pixel PX1, the initialization circuit AIC2 of the second pixel PX2, and the initialization circuit AIC3 of the third pixel PX3 may include the initialization transistor TA. The initialization circuit AIC2 of the second pixel PX2 and the initialization circuit AIC3 of the third pixel PX3 may further include at least one diode-connected transistor TD. The number of diode-connected transistors TD included in the initialization circuit AIC2 of the second pixel PX2 and the number of diode-connected transistors TD included in the initialization circuit AIC3 of the third pixel PX3 may be different from each other. For example, the initialization circuit AIC2 of the second pixel PX2 may include one diode-connected transistor TD, and the initialization circuit AIC3 of the third pixel PX3 may include a pair of a first diode-connected transistor TD1 and a second diode-connected transistor TD2 that are connected in series.

As shown in FIG. 17, nodes Nb1 between the initialization transistor TA and the diode-connected transistor TD of the second pixels PX2 may be connected by a first node connection line NCL1. Nodes Nb2 between the initialization transistor TA and the diode-connected transistor TD of the third pixels PX3 may be connected by a second node connection line NCL2. Each of the first node connection line NCL1 and the second node connection line NCL2 may be provided in units of rows, or the first node connection lines NCL1 of two or more rows may be connected to each other, and the second node connection lines NCL2 of two or more rows may be connected to each other.

FIG. 17 illustrates an embodiment where the diode-connected transistor TD is connected between the initialization transistor TA and the initialization voltage line AIL. FIG. 18 illustrates an embodiment where the initialization transistor TA is connected between the diode-connected transistor TD and the initialization voltage line AIL.

Figure 19:
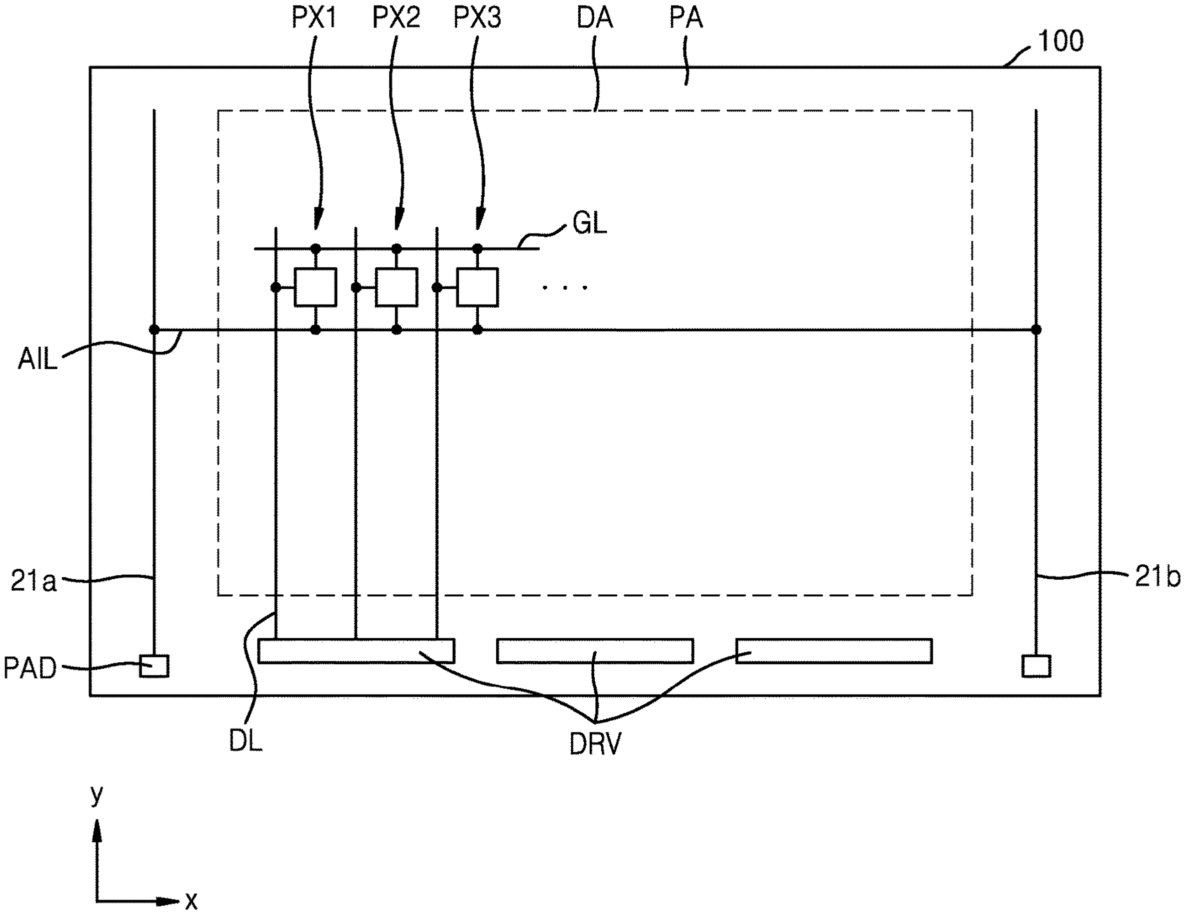
FIG. 19 is a plan view schematically illustrating a display panel, according to an embodiment.
Figure 20A:
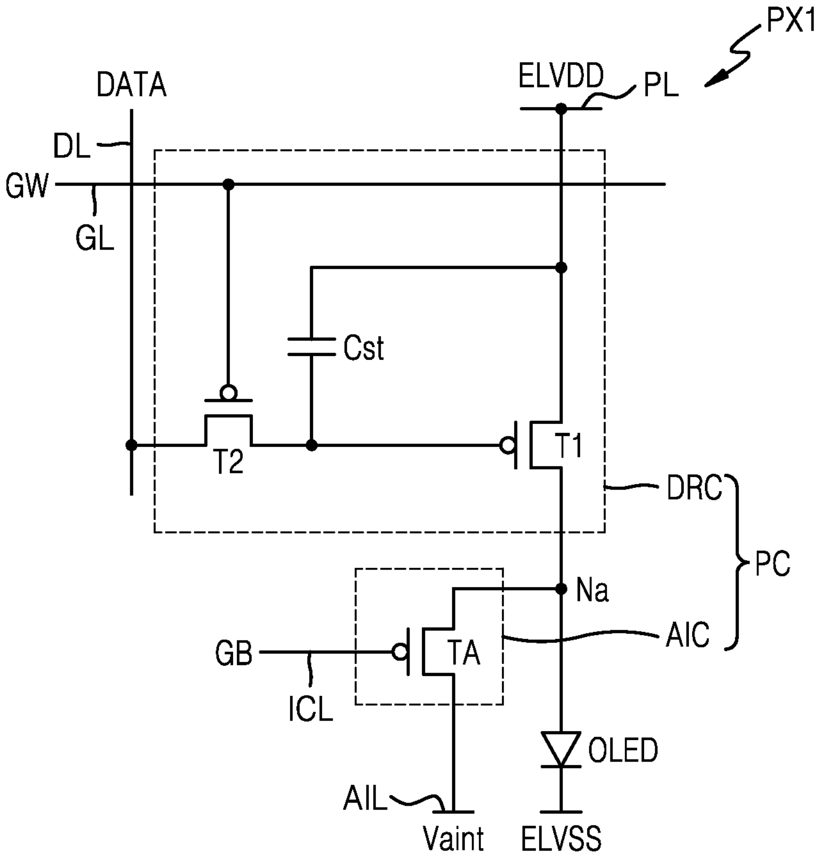
FIGS. 20A and 20B are equivalent circuit diagrams illustrating a pixel circuit, according to an embodiment.
Figure 20B:
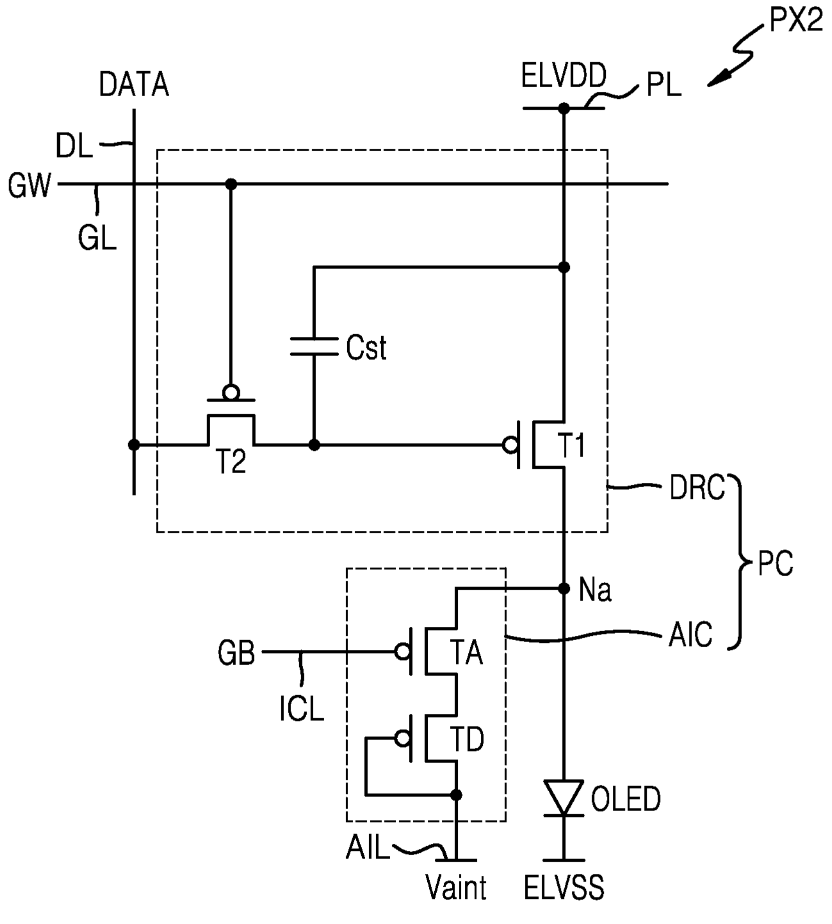

FIG. 19 is a plan view schematically illustrating a display panel, according to an embodiment. FIGS. 20A and 20B are equivalent circuit diagrams illustrating a pixel circuit, according to an embodiment.

A display apparatus may include a display panel, and a cover window (not shown) that protects the display panel may be further located on the display panel. In a plan view, the display panel may have a rectangular shape as shown in FIG. 19. The display panel may include the display area DA where a plurality of pixels PX are located and the peripheral area PA outside the display area DA. Various elements constituting the display panel are located on a substrate 100. Accordingly, the substrate 100 may include the display area DA and the peripheral area PA.

In the peripheral area PA, terminals PAD that are connected to conductive lines for transmitting an electrical signal to be applied to the display area DA for driving a pixel circuit and transmit an external signal to the conductive lines, and a display driving circuit DRV may be located. The conductive lines for transmitting an electrical signal may include a driving voltage supply line (not shown) that supplies the first driving voltage ELVDD, and initialization voltage supply lines 21*a* and 21*b* that supply the initialization voltage Vaint.

The initialization voltage supply lines 21*a* and 21*b* may be connected to the terminals PAD, and may extend in the y-direction while at least surrounding a left side and/or a right side of the display area DA. The initialization voltage supply lines 21*a* and 21*b* may be connected to the initialization voltage lines AIL of the display area DA. The initialization voltage Vaint may be applied to pixel circuits of the pixels PX through the initialization voltage line AIL connected to the initialization voltage supply lines 21*a* and 21*b*.

The display driving circuit DRV may be formed as at least one integrated circuit chip and may be mounted on the substrate 100. The display driving circuit DRV may generate a data signal, and the data signal may be transmitted to the pixel circuits of the pixels through the data line DL of the display area DA. The display driving circuit DRV may generate a control signal transmitted to a gate driving circuit (not shown) located in the peripheral area PA. The gate driving circuit may be located in the peripheral area PA on a left side and/or a right side of the substrate 100 with the display area DA therebetween. The gate driving circuit may overlap some, e.g., initialization voltage supply line, etc., of the conductive lines located in the peripheral area PA. The gate driving circuit may generate a gate signal, and the gate signal may be transmitted to the pixels through the gate line GL of the display area DA.

A plurality of first pixels PX1 and a plurality of second pixels PX2 may be arranged in the display area DA. Referring to FIGS. 20A and 20B, the pixel circuit PC of the first pixel PX1 and the pixel circuit PC of the second pixel PX2 may include the driving circuit DRC and the initialization circuit AIC. The pixel circuit PC may be connected to the data line DL and the gate line GL. Also, the pixel circuit PC may be connected to the initialization voltage line AIL and the driving voltage line PL. The pixel circuit PC may be connected to the organic light-emitting diode OLED that is a display element at the node Na. The pixel circuit PC may include the driving circuit DRC and the initialization circuit AIC.

The pixel circuit PC of one of the first pixel PX1 and the second pixel PX2 may include an initialization circuit including the initialization transistor TA and the diode-connected transistor TD, and the remaining pixel circuit PC may include an initialization circuit including only the initialization transistor TA. For convenience of explanation, the following will be described assuming that the first pixel PX1 includes an initialization circuit including only the initialization transistor TA, and the second pixel PX2 includes an initialization circuit including the initialization transistor TA and the diode-connected transistor TD. In an embodiment, a plurality of third pixels PX3 may be further arranged in the display area DA. A pixel circuit of the third pixel PX3 may be the same as the pixel circuit PC of the first pixel PX1 or the pixel circuit PC of the second pixel PX2.

According to a type (N-type or P-type) and/or an operating condition of a transistor, a first terminal of the transistor may be a source or a drain and a second terminal may be an electrode different from the first terminal. For example, when the first terminal is a source, the second terminal may be a drain.

The driving circuit DRC of each of the first pixel PX1 and the second pixel PX2 may include a first transistor T1, a second transistor T2, and a capacitor Cst.

The first transistor T1 may be connected between the driving voltage line PL and the organic light-emitting diode OLED. The first transistor T1 may include a gate, a first terminal connected to the driving voltage line PL, and a second terminal connected to the node Na. The driving voltage line PL may transmit the first driving voltage ELVDD to the first transistor T1. The first transistor T1 may function as a driving transistor, and may receive a data signal DATA according to a switching operation of the second transistor T2 and may supply driving current to the organic light-emitting diode OLED.

The second transistor T2 may be connected between the data line DL and the gate of the first transistor T1. The second transistor T2 may include a gate connected to the gate line GL, a first terminal connected to the data line DL, and a second terminal connected to the gate of the first transistor T1. The second transistor T2 may be turned on according to a gate signal GW received through the gate line GL, and may perform a switching operation of transmitting the data signal DATA received through the data line DL to the gate of the first transistor T1.

The capacitor Cst may include a first terminal connected to the gate of the first transistor T1 and a second terminal connected to the driving voltage line PL. The capacitor Cst may maintain a voltage applied to the gate of the first transistor T1 by storing and maintaining a voltage corresponding to a voltage difference between the gate of the first transistor T1 and the driving voltage line PL.

As shown in FIG. 20A, the initialization circuit AIC of the first pixel PX1 may include the initialization transistor TA. The initialization transistor TA may include a gate connected to the initialization control line ICL, a first terminal connected to the node Na, and a second terminal connected to the initialization voltage line AIL. The initialization transistor TA may be turned on by a control signal GB received through the initialization control line ICL, and may transmit the initialization voltage Vaint supplied through the initialization voltage line AIL to the node Na.

As shown in FIG. 20B, the initialization circuit AIC of the second pixel PX2 may include the initialization transistor TA and at least one diode-connected transistor TD. The initialization transistor TA may include a gate connected to the initialization control line ICL, a first terminal connected to the node Na, and a second terminal connected to the initialization voltage line AIL. The diode-connected transistor TD may be connected between the initialization transistor TA and the initialization voltage line AIL. Thus, the second terminal of the initialization transistor TA may be connected to a first terminal of the diode-connected transistor TD. In an embodiment, at least one diode-connected transistor TD may be connected between the node Na and the initialization transistor TA.

Figure 21A:
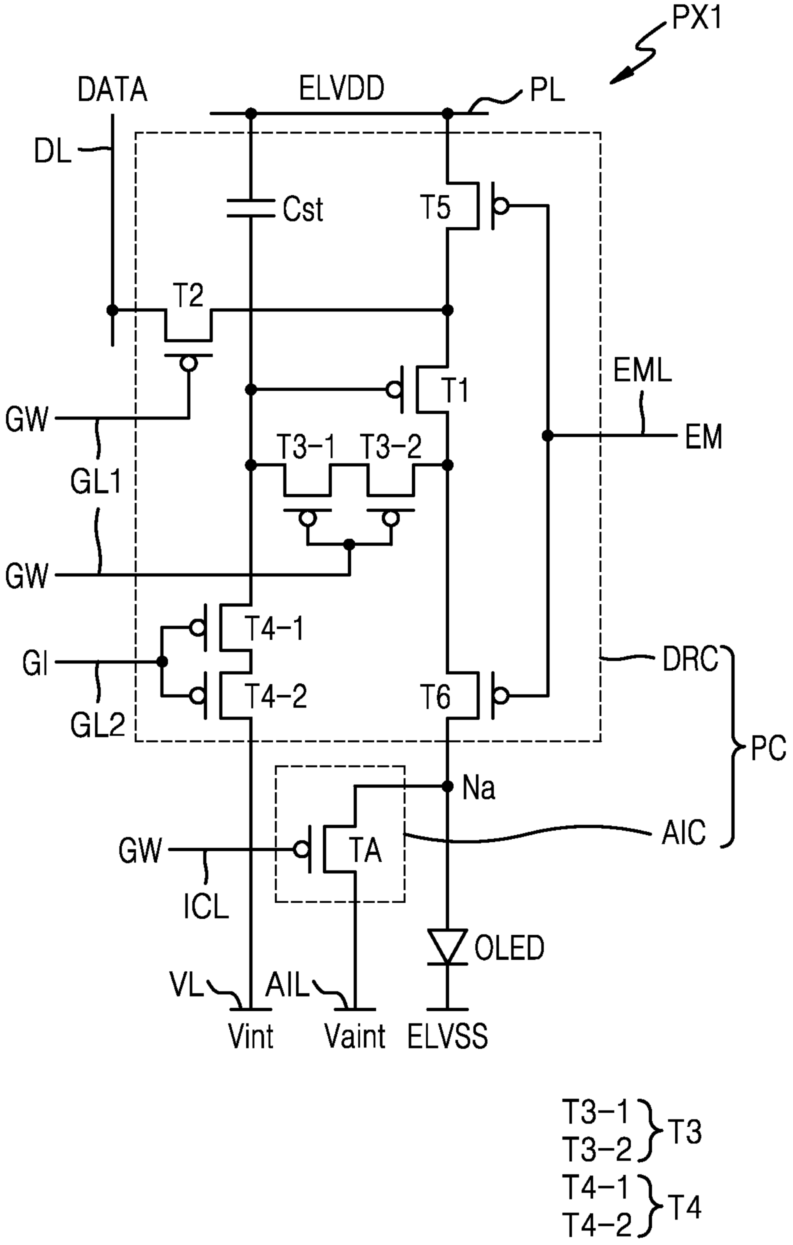
FIGS. 21A and 21B are equivalent circuit diagrams illustrating a pixel circuit, according to an embodiment.
Figure 21B:
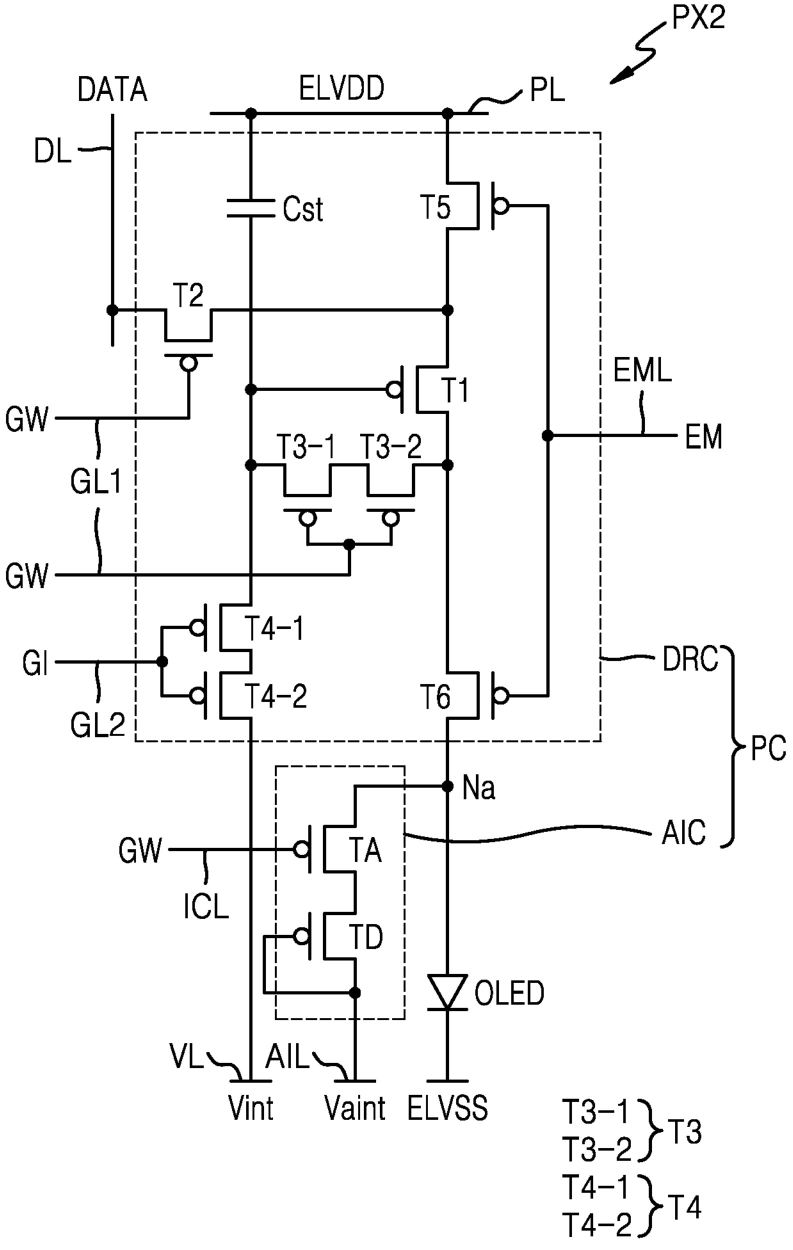

FIGS. 21A and 21B are equivalent circuit diagrams illustrating a pixel circuit, according to an embodiment. A difference from FIGS. 20A and 20B will be mainly described.

Referring to FIGS. 21A and 21B, the driving circuit DRC of each of the first pixel PX1 and the second pixel PX2 may include first to sixth transistors T1, T2, T3, T4, T5, and T6 and a capacitor Cst.

The first transistor T1 may be connected between the driving voltage line PL and the organic light-emitting diode OLED. The first transistor T1 may be connected to the driving voltage line PL via the fifth transistor T5, and may be electrically connected to the organic light-emitting diode OLED via the sixth transistor T6. The first transistor T1 may include a gate, a first terminal connected to a second terminal of the fifth transistor T5, and a second terminal connected to a first terminal of the sixth transistor T6. The first transistor T1 may function as a driving transistor, and may receive a data signal DATA according to a switching operation of the second transistor T2 and may supply driving current to the organic light-emitting diode OLED.

The second transistor T2 (data write transistor) may be connected between the data line DL and the first terminal of the first transistor T1. The second transistor T2 may be connected to the driving voltage line PL via the fifth transistor T5. The second transistor T2 may include a gate connected to a first gate line GL1, a first terminal connected to the data line DL, and a second terminal connected to the first terminal of the first transistor T1. The second transistor T2 may be turned on according to a first gate signal GW received through the first gate line GL1, and may perform a switching operation of transmitting the data signal DATA received through the data line DL to the first terminal of the first transistor T1.

The third transistor T3 (compensation transistor) may be connected between the gate of the first transistor T1 and the second terminal of the first transistor T1. The third transistor T3 may be electrically connected to the organic light-emitting diode OLED via the sixth transistor T6. The third transistor T3 may include a first sub-transistor T3-1 and a second sub-transistor T3-2 that are connected in series. Each of the first sub-transistor T3-1 and the second sub-transistor T3-2 may include a gate connected to the first gate line GL1. The first sub-transistor T3-1 and the second sub-transistor T3-2 may be turned on according to the first gate signal GW received through the first gate line GL1, and may compensate for a threshold voltage of the first transistor T1 by diode-connecting the first transistor T1.

The fourth transistor T4 (node initialization transistor) may be connected between a node initialization voltage line VL and the gate of the first transistor T1. The fourth transistor T4 may include a first sub-transistor T4-1 and a second sub-transistor T4-2 that are connected in series. Each of the first sub-transistor T4-1 and the second sub-transistor T4-2 may include a gate connected to a second gate line GL2. The first sub-transistor T4-1 and the second sub-transistor T4-2 may be turned on according to a second gate signal GI received through the second gate line GL2, and may initialize the gate of the first transistor T1 by transmitting a node initialization voltage Vint to the gate of the first transistor T1.

The fifth transistor T5 (first emission control transistor) may be connected between the driving voltage line PL and the first terminal of the first transistor T1. The sixth transistor T6 (second emission control transistor) may be connected between the second terminal of the first transistor T1 and the organic light-emitting diode OLED. The fifth transistor T5 may include a gate connected to an emission control line EML, a first terminal connected to the driving voltage line PL, and the second terminal connected to the first terminal of the first transistor T1. The sixth transistor T6 may include a gate connected to the emission control line EML, the first terminal connected to the second terminal of the first transistor T1, and a second terminal connected to the pixel electrode of the organic light-emitting diode OLED. The fifth transistor T5 and the sixth transistor T6 are simultaneously turned on according to an emission control signal EM received through the emission control line EML, and driving current flows through the organic light-emitting diode OLED.

The capacitor Cst may include a first terminal connected to the gate of the first transistor T1 and a second terminal connected to the driving voltage line PL. The capacitor Cst may maintain a voltage applied to the gate of the first transistor T1 by storing and maintaining a voltage corresponding to a voltage difference between the gate of the first transistor T1 and the driving voltage line PL.

As shown in FIG. 21A, the initialization circuit AIC of the first pixel PX1 may include the initialization transistor TA. The initialization transistor TA may include a gate connected to the initialization control line ICL, a first terminal connected to the node Na, and a second terminal connected to the initialization voltage line AIL. A control signal GW transmitted through the initialization control line ICL may be the first gate signal GW. The initialization transistor TA may be turned on by the control signal GW received through the initialization control line ICL, and may transmit the initialization voltage Vaint supplied through the initialization voltage line AIL to the node Na.

As shown in FIG. 21B, the initialization circuit AIC of the second pixel PX2 may include the initialization transistor TA and at least one diode-connected transistor TD. The initialization transistor TA may include a gate connected to the initialization control line ICL, a first terminal connected to the node Na, and a second terminal connected to the initialization voltage line AIL. The diode-connected transistor TD may be connected between the initialization transistor TA and the initialization voltage line AIL. Thus, the second terminal of the initialization transistor TA may be connected to a first terminal of the diode-connected transistor TD. In an embodiment, the at least one diode-connected transistor TD may be connected between the node Na and the initialization transistor TA.

Figure 22A:
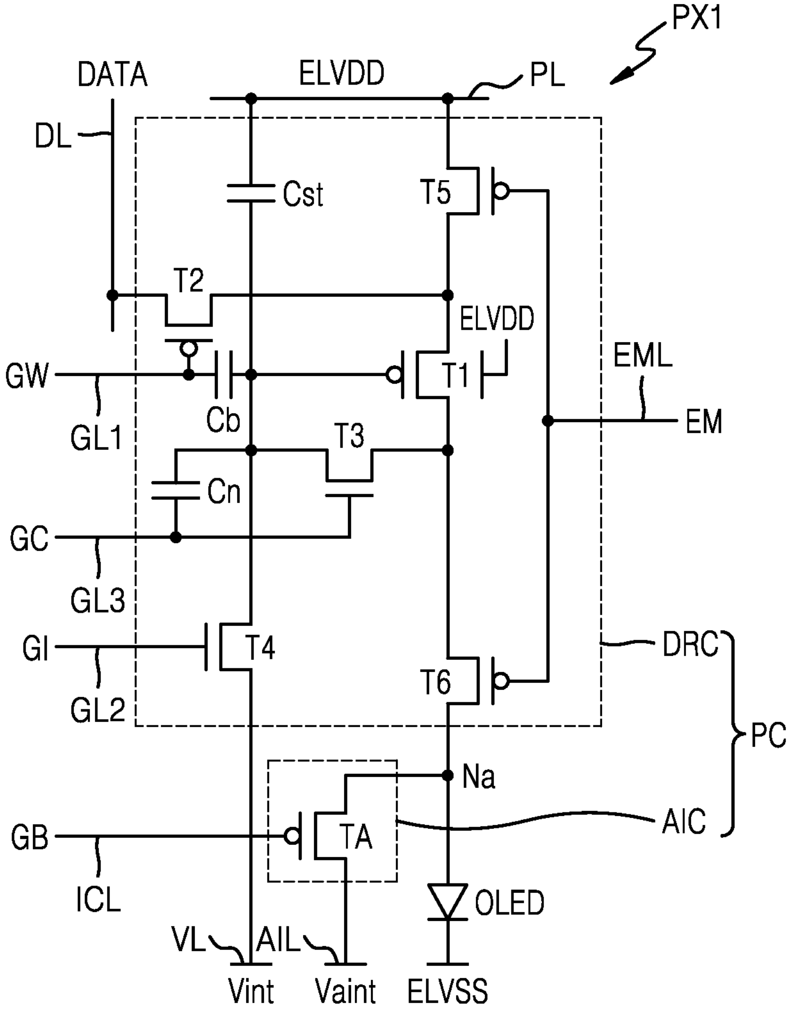
FIGS. 22A and 22B are equivalent circuit diagrams illustrating a pixel circuit, according to an embodiment.
Figure 22B:
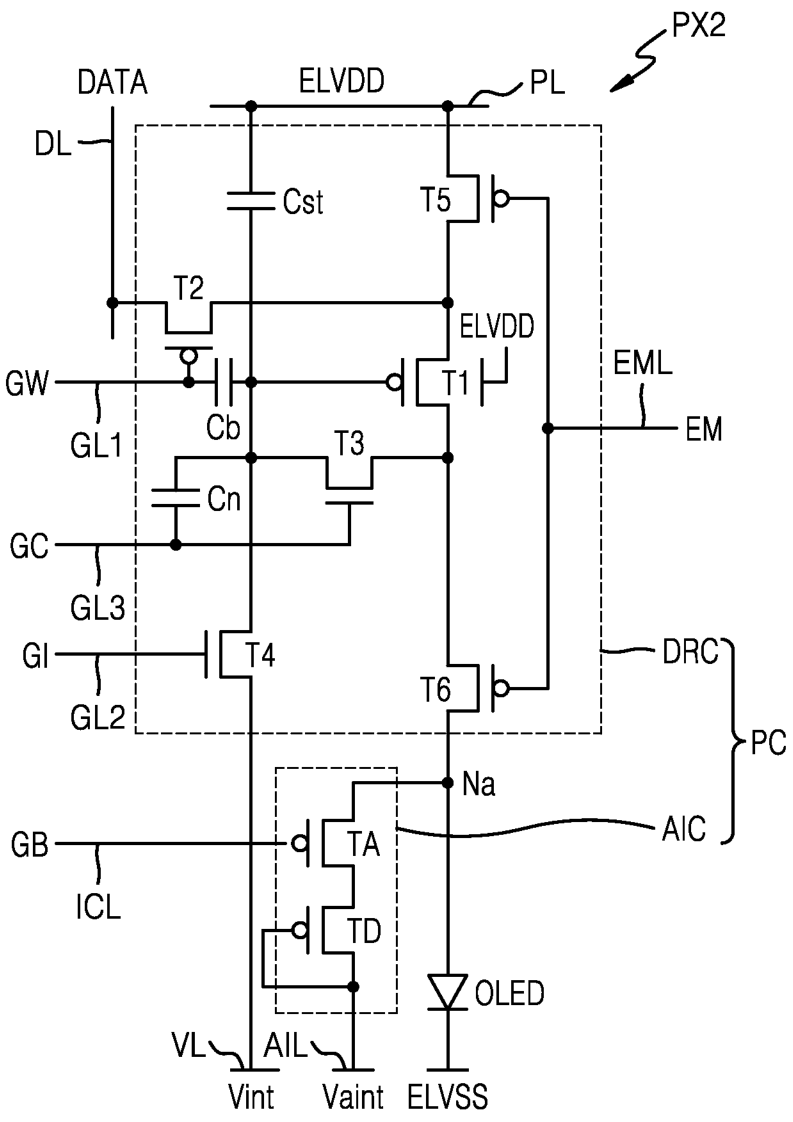

FIGS. 22A and 22B are equivalent circuit diagrams illustrating a pixel circuit, according to an embodiment. A difference from FIGS. 21A and 21B will be mainly described.

Referring to FIGS. 22A and 22B, the driving circuit DRC of each of the first pixel PX1 and the second pixel PX2 may include first to sixth transistors T1, T2, T3, T4, T5, and T6 and capacitors Cst, Cb, and Cn.

The third transistor T3 and the fourth transistor T4 may be N-type transistors, and the rest may be P-type transistors. In an embodiment, the third transistor T3 and the fourth transistor T4 may be single transistors. In an embodiment, the third transistor T3 and the fourth transistor T4 may include a plurality of sub-transistors as shown in FIGS. 21A and 21B. A gate of the third transistor T3 may be connected to a third gate line GL3 through which a third gate signal GC is supplied.

The capacitor Cb may be connected between a gate of the first transistor T1 and a gate of the second transistor T2. The capacitor Cn may be connected between a first terminal and the gate of the third transistor T3.

As shown in FIG. 22A, the initialization circuit AIC of the first pixel PX1 may include the initialization transistor TA. The initialization transistor TA may be turned on by a control signal GB received through the initialization control line ICL, and may transmit the initialization voltage Vaint supplied through the initialization voltage line AIL to the node Na.

As shown in FIG. 22B, the initialization circuit AIC of the second pixel PX2 may include the initialization transistor TA and at least one diode-connected transistor TD. The at least one diode-connected transistor TD may be connected between the initialization transistor TA and the initialization voltage line AIL. In an embodiment, the at least one diode-connected transistor TD may be connected between the node Na and the initialization transistor TA.

In the above embodiments, the initialization circuit AIC of at least one color pixel of the first pixel PX1, the second pixel PX2, and the third pixel PX3 includes the initialization transistor TA and at least one diode-connected transistor TD. In an embodiment, at least one diode-connected transistor TD may not be included in a pixel circuit, but may be located in a peripheral area of a display apparatus and may be shared by a plurality of pixels of a display area.

Figure 23:
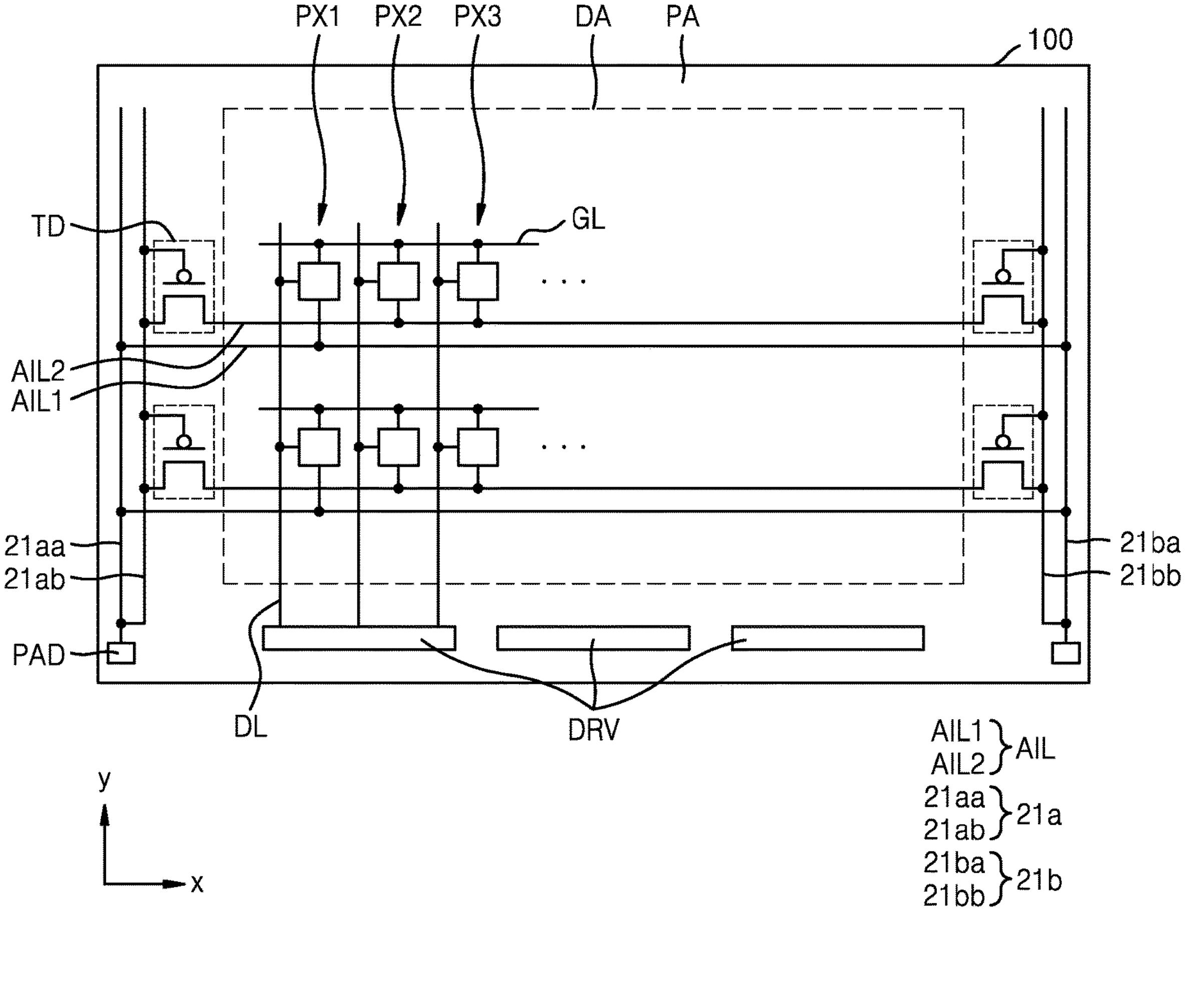
FIGS. 23 and 24 are plan views schematically illustrating a display panel, according to an embodiment.
Figure 24:
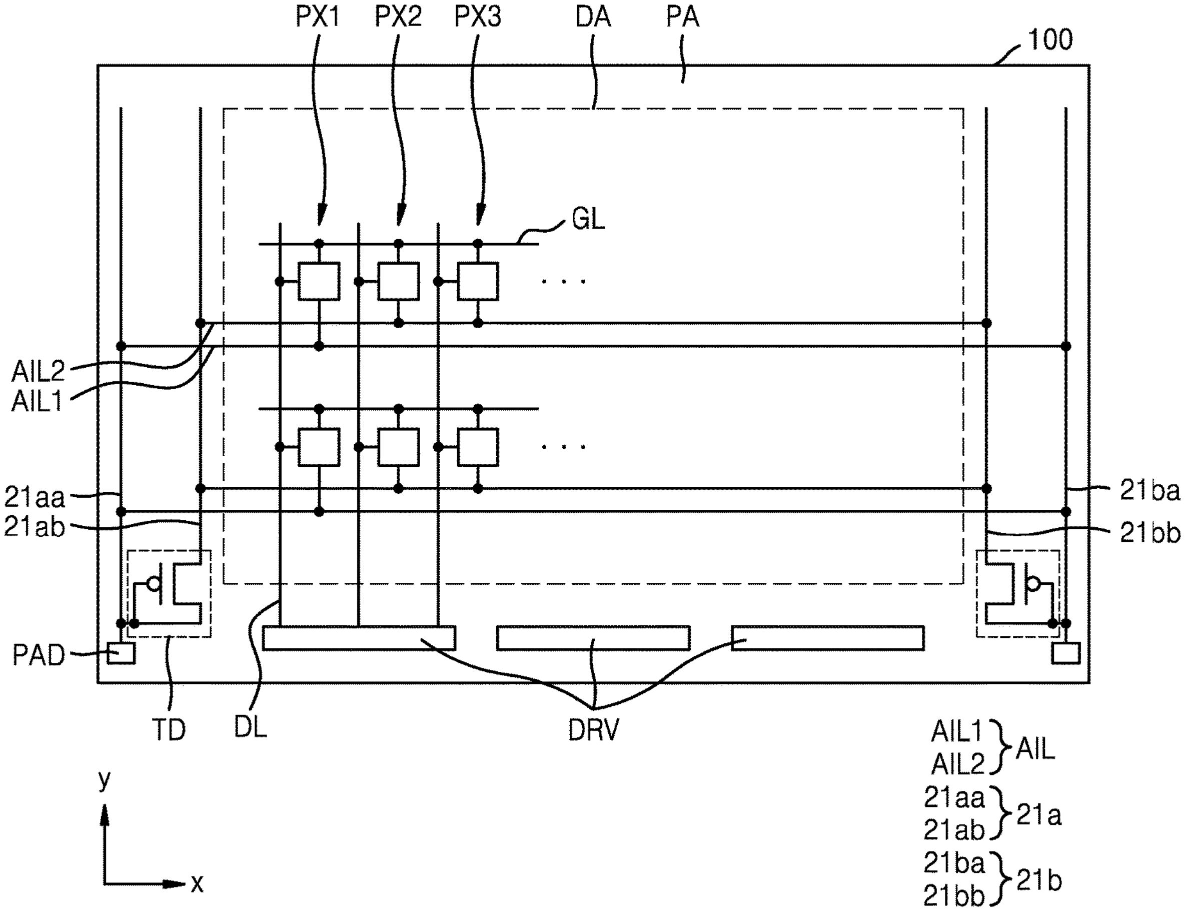

FIGS. 23 and 24 are plan views schematically illustrating a display panel, according to an embodiment. A difference from the above embodiments will be mainly described.

In the display area DA, a plurality of first pixels PX1, a plurality of second pixels PX2, and a plurality of third pixels PX3 may be located. The pixel circuit PC of each of the first pixel PX1, the second pixel PX2, and the third pixel PX3 may include the driving circuit DRC and the initialization circuit AIC as shown in FIGS. 4, 20A, 21A, and 22A. The driving circuit DRC of the first pixel PX1, the second pixel PX2, and the third pixel PX3 may include the first transistor T1 that is a driving transistor and may output driving current to an organic light-emitting diode. The initialization circuit AIC of the first pixel PX1, the second pixel PX2, and the third pixel PX3 may include only the initialization transistor TA.

A first initialization voltage line AIL1 and a second initialization voltage line AIL2 may extend in the x-direction for each row. The first initialization voltage line AIL1 may be connected to the first pixels PX1, and the second initialization voltage line AIL2 may be connected to the second pixels PX2 and the third pixels PX3.

The initialization voltage supply lines 21*a* and 21*b* located in the peripheral area PA may be connected to the terminals PAD, and may extend in the y-direction while at least surrounding a left side and/or a right side of the display area DA. The initialization voltage supply lines 21*a* and 21*b* may be connected to the first initialization voltage lines AIL1 and the second initialization voltage lines AIL2 of the display area DA.

The initialization voltage supply lines 21*a* and 21*b* may include first initialization voltage supply lines 21*aa* and 21*ba* and second initialization voltage supply lines 21*ab* and 21*bb*. The first initialization voltage supply lines 21*aa* and 21*ba* may be connected to the first initialization voltage lines AIL1. Pixel electrodes of organic light-emitting diodes of the first pixels PX1 may be initialized to the initialization voltage Vaint through the first initialization voltage line AIL1 connected to the first initialization voltage supply lines 21*aa* and 21*ba*.

In an embodiment, as shown in FIG. 23, the first initialization voltage supply lines 21*aa* and 21*ba* and the second initialization voltage supply lines 21*ab* and 21*bb* may supply the initialization voltage Vaint. At least one diode-connected transistor TD may be connected between the second initialization voltage supply lines 21*ab* and 21*bb* and the second initialization voltage line AIL2. At least one diode-connected transistor TD may correspond to each row and may be provided in the peripheral area PA. The diode-connected transistor TD may be connected between the second initialization voltage supply lines 21*ab* and 21*bb* and the second initialization voltage line AIL2 in the peripheral area PA. A gate and a second terminal of the diode-connected transistor TD may be connected to the second initialization voltage supply lines 21*ab* and 21*bb*, and a first terminal of the diode-connected transistor TD may be connected to the second initialization voltage line AIL2. Accordingly, a value Vaint−Vthd obtained by subtracting the threshold voltage Vthd of the diode-connected transistor TD from the initialization voltage Vaint may be supplied as a second initialization voltage to the second initialization voltage line AIL2. Pixel electrodes of organic light-emitting diodes of the second pixels PX2 and the third pixels PX3 may be initialized to the second initialization voltage Vaint−Vthd through the second initialization voltage line AIL2 connected to the second initialization voltage supply lines 21*ab* and 21*bb*.

In an embodiment, as shown in FIG. 24, at least one diode-connected transistor TD may correspond to a plurality of rows and may be provided in the peripheral area PA. The diode-connected transistor TD may be connected between the first initialization voltage supply line 21*aa* and the second initialization voltage supply line 21*ab* and between the first initialization voltage supply line 21*ba* and the second initialization voltage supply line 21*bb*, in the peripheral area PA. A gate and a second terminal of the diode-connected transistor TD may be connected to the first initialization voltage supply lines 21*aa* and 21*ba*, and a first terminal of the diode-connected transistor TD may be connected to the second initialization voltage supply lines 21*ab* and 21*bb*. Accordingly, a value Vaint−Vthd obtained by subtracting the threshold voltage Vthd of the diode-connected transistor TD from the initialization voltage Vaint may be supplied as a second initialization voltage to the second initialization voltage supply lines 21*ab* and 21*bb*. The first initialization voltage supply lines 21*aa* and 21*ba* may supply the initialization voltage Vaint as a first initialization voltage, and the second initialization voltage supply lines 21*ab* and 21*bb* may supply the initialization voltage Vaint−Vthd as a second initialization voltage. Pixel electrodes of organic light-emitting diodes of the second pixels PX2 and the third pixels PX3 may be initialized to the second initialization voltage Vaint−Vthd through the second initialization voltage line AIL2 connected to the second initialization voltage supply lines 21*ab* and 21*bb*.

According to embodiments, a different initialization voltage may be applied to one electrode of an organic light-emitting diode of pixels that emit light of different colors without adding a voltage source, by using a diode-connected transistor. Thus, deterioration in image quality characteristics due to a difference in material characteristics of organic light-emitting diodes may be prevented.

According to an embodiment, a display apparatus with improved image quality characteristics may be provided by compensating for electrical characteristics of an organic light-emitting diode for each of pixels that emit light of different colors. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A pixel comprising:

a driving circuit connected to a gate line and a data line and comprising a driving transistor;

a light-emitting diode connected to the driving circuit; and an initialization circuit connected between an initialization voltage line and a node to which the driving circuit and the light-emitting diode are connected, the initialization circuit being configured to transmit a second initialization voltage which is different from a first initialization voltage supplied through the initialization voltage line, to the node, wherein the initialization circuit comprises:

an initialization transistor comprising a gate connected to an initialization control line, a first terminal connected to the node, and a second terminal; and a plurality of diode-connected transistors connected in series between the initialization transistor and the initialization voltage line, wherein the plurality of diode-connected transistors comprise:

a first diode-connected transistor comprising a first terminal connected to a second terminal of a diode-connected transistor adjacent to the first diode-connected transistor, and a gate and a second terminal connected to the initialization voltage line; and a second diode-connected transistor comprising a first terminal connected to the second terminal of the initialization transistor, and a gate and a second terminal connected to a first terminal of a diode-connected transistor adjacent to the second diode-connected transistor.

2. A pixel comprising:

a driving circuit connected to a gate line and a data line and comprising a driving transistor;

a light-emitting diode connected to the driving circuit; and an initialization circuit connected between an initialization voltage line and a node to which the driving circuit and the light-emitting diode are connected, the initialization circuit being configured to transmit a second initialization voltage which is different from a first initialization voltage supplied through the initialization voltage line, to the node, wherein the initialization circuit comprises:

an initialization transistor comprising a gate connected to an initialization control line, a first terminal, and a second terminal connected to the initialization voltage line; and a plurality of diode-connected transistors connected in series between the node and the initialization transistor, wherein the plurality of diode-connected transistors comprise:

a first diode-connected transistor comprising a first terminal connected to a second terminal of a diode-connected transistor adjacent to the first diode-connected transistor, and a gate and a second terminal connected to the first terminal of the initialization transistor; and a second diode-connected transistor comprising a first terminal connected to the node, and a gate and a second terminal connected to a first terminal of a diode-connected transistor adjacent to the second diode-connected transistor.

* * * * *